US012731544B2

(12) United States Patent
Lee et al.

(10) Patent No.: US 12,731,544 B2
(45) Date of Patent: Sep. 8, 2026

(54) DISPLAY PANEL AND DISPLAY DEVICE INCLUDING THE SAME

(71) Applicant: LG Display Co., Ltd., Seoul (KR)

(72) Inventors: Wonho Lee, Paju-si (KR); Inyeong Kong, Seoul (KR); Wondoo Kim, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/984,511

(22) Filed: Dec. 17, 2024

(65) Prior Publication Data

US 2025/0273147 A1 Aug. 28, 2025

(30) Foreign Application Priority Data

Feb. 22, 2024 (KR) ........................ 10-2024-0026066

(51) Int. Cl.

*G09G 3/3233* (2016.01)
*H10K 59/131* (2023.01)
*G09G 3/32* (2016.01)

(52) U.S. Cl.

CPC ......... *G09G 3/3233* (2013.01); *H10K 59/131* (2023.02); *G09G 3/32* (2013.01); *G09G 2300/0426* (2013.01); *G09G 2300/0452* (2013.01); *G09G 2300/0465* (2013.01); *G09G 2300/0842* (2013.01); *G09G 2320/0233* (2013.01); *G09G 2320/0242* (2013.01); *G09G 2320/043* (2013.01); *G09G 2330/021* (2013.01)

(58) Field of Classification Search

CPC ......... G09G 3/3233; G09G 2300/0426; G09G 2300/0452; G09G 2300/0465; G09G 2300/0842; G09G 2320/0233; G09G 2320/0242; G09G 2320/043; H10K 59/131

See application file for complete search history.

(56) References Cited

U.S. PATENT DOCUMENTS 9,766,495 B2 9/2017 Iwatsu et al.
2015/0379947 A1* 12/2015 Sang ................ G02F 1/136286 349/37
2022/0198987 A1 6/2022 Kim et al.
2023/0061191 A1 3/2023 Oh et al.

FOREIGN PATENT DOCUMENTS

JP 2016-71363 A 5/2016
KR 10-2017-0006321 A 1/2017
KR 10-2023-0033376 A 3/2023

* cited by examiner

*Primary Examiner* — Dennis P Joseph
(74) *Attorney, Agent, or Firm* — Birch, Stewart, Kolasch & Birch, LLP

(57) ABSTRACT

A display device and a display panel can be provided in which occurrence of a column-directional line mura defect due to the differences between the luminance of pixels is suppressed, and in which an aperture ratio of each pixel is improved. The display panel can include a first pixel and a second pixel arranged in an n-th row and disposed adjacent to each other in a first direction; and a first pixel and a second pixel arranged in an (n+1)-st row and disposed adjacent to each other in the first direction. The n-th row and the (n+1)-st row are arranged in a second direction intersecting the first direction. Both an n-th gate line and an (n+1)-st gate line are disposed between the first and second pixels of the n-th row and the first and second pixels of the (n+1)-st row.

7 Claims, 13 Drawing Sheets

DISPLAY PANEL AND DISPLAY DEVICE INCLUDING THE SAME

CROSS-REFERENCE TO RELATED APPLICATION

This application claims priority to Korean Patent Application No. 10-2024-0026066, filed on Feb. 22, 2024, in the Korean Intellectual Property Office, under 35 U.S.C. § 119, the entire contents of which are hereby expressly incorporated by reference into the present application.

BACKGROUND

Field

The present disclosure relates to a display panel in which occurrence of a column-directional line mura defect due to differences between luminance of pixels is suppressed, and an aperture ratio of each pixel is improved, and a display device including the same.

Discussion of the Related Art

An organic light-emitting display device includes an organic light-emitting diode (hereinafter referred to as "OLED") that emits light on its own, and has the advantages of fast response speed, high luminous efficiency, high luminance, and large viewing angle. The organic light-emitting display device not only has a fast response speed and excellent luminous efficiency, high luminance, and large viewing angle, but also has excellent contrast ratio and color gamut because the organic light-emitting display device can express a black gray level as perfect black.

In a DRD (Double Rate Driving) scheme pixel with a flip structure as used conventionally, odd and even-numbered pixels are arranged in a row direction (X-axis direction) such that one of the odd and even-numbered pixels has a flipped structure in a column direction (Y-axis direction) relative to a structure of the other thereof. Thus, a capacitance between a gate line extending by each pixel circuit and a gate node of a driving element of the pixel circuit in the odd-number pixel and a capacitance between a gate line extending by each pixel circuit and a gate node of a driving element of the pixel circuit in the even-number pixel can be different from each other. This difference can lead to a difference between the luminance of the odd and even-numbered pixels. Thus, a column-directional line mura defect can be perceived by a user's eyes.

Further, various studies are being conducted to secure an aperture ratio of the organic light-emitting display device. However, since there are a large number of wirings needed to drive pixels, it can be difficult to achieve an aperture ratio improvement design. Moreover, it can be more difficult to secure the aperture ratio when each pixel is composed of sub-pixels emitting light of four colors including red, green, blue, and white.

SUMMARY OF THE DISCLOSURE

In order to solve the above-described limitations, the inventors of the present disclosure have invented a display panel in which occurrence of the column-directional line mura defect due to differences between luminance of the pixels is suppressed, and an aperture ratio of each pixel is improved, and a display device including the same.

A purpose of the present disclosure is to provide a display panel in which the asymmetric structure due to the conventional flip structure is removed in that two gate lines arranged in a column direction and extending in a row direction intersect each other in a pixel border area between odd and even-numbered pixels arranged in the row direction such that a difference between the luminance of the odd and even-numbered pixels can be removed, and thus, a column-directional line mura defect can be removed and the aperture ratio can be improved.

A purpose of the present disclosure is to provide a display device including the above defined display panel.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

A first aspect of the present disclosure provides a display panel comprising: a first pixel and a second pixel arranged in an n-th row and disposed adjacent to each other in a first direction; and a first pixel and a second pixel arranged in an (n+1)-st row and disposed adjacent to each other in the first direction, wherein the n-th row and the (n+1)-st row are arranged in a second direction intersecting the first direction, wherein each of the first pixel and the second pixel in each of the n-th row and the (n+1)-st row includes first to fourth sub-pixels respectively emitting light of different colors, wherein both an n-th gate line and an (n+1)-st gate line are disposed between the first and second pixels of the n-th row and the first and second pixels of the (n+1)-st row, wherein the n-th gate line and the (n+1)-st gate line intersect each other in a pixel border area between the first pixel and the second pixel.

A second aspect of the present disclosure provides a display panel comprising: a first pixel and a second pixel arranged in an n-th row and disposed adjacent to each other in a first direction; and a first pixel and a second pixel arranged in an (n+1)-st row and disposed adjacent to each other in the first direction, wherein the n-th row and the (n+1)-st row are arranged in a second direction intersecting the first direction, wherein each of the first pixel and the second pixel in each of the n-th row and the (n+1)-st row includes first to fourth sub-pixels respectively emitting light of different colors, wherein an n-th gate line and an (n+1)-st gate line intersect each other in a pixel border area between the first pixel and the second pixel, wherein the n-th gate line is disposed on one of both opposing sides in the second direction of the first pixel and then is disposed on the other of both opposing sides in the second direction of the second pixel PXL2 arranged in the n-th row, wherein the (n+1)-st gate line is disposed on the other of both opposing sides in the second direction of the first pixel and then is disposed on one of both opposing sides in the second direction of the second pixel arranged in the n-th row.

A third aspect of the present disclosure provides a display device comprising: a display panel including a plurality of data lines, a plurality of gate lines, a plurality of power lines, and a plurality of pixels; a data driver configured to convert pixel data into data voltage and supply the data voltage to the data lines; a gate driver configured to sequentially supply gate pulses to the gate lines; and a timing controller configured to transmit the pixel data to the data driver and control the data driver and the gate driver, wherein the plurality of pixels include: a first pixel and a second pixel arranged in an n-th row and disposed adjacent to each other in a first direction; and a first pixel and a second pixel arranged in an (n+1)-st row and disposed adjacent to each other in the first direction, wherein the n-th row and the (n+1)-st row are arranged in a second direction intersecting the first direction, wherein each of the first pixel and the second pixel in each of the n-th row and the (n+1)-st row includes first to fourth sub-pixels respectively emitting light of different colors, wherein an n-th gate line is connected to each of the first pixel and the second pixel of the n-th row, wherein an (n+1)-st gate line is connected to each of the first pixel and the second pixel of the (n+1)-st row, wherein the n-th gate line and the (n+1)-st gate line intersect each other in a pixel border area between the first pixel and the second pixel.

According to an embodiment of the present disclosure, the asymmetric structure due to the conventional flip structure is removed so that the odd and even-numbered pixels are arranged in a non-flip manner with each other.

According to an embodiment of the present disclosure, two gate lines arranged in a column direction and extending in a row direction intersect each other in a pixel border area between odd and even-numbered pixels arranged in the row direction such that a difference between luminance of the odd and even-numbered pixels can be removed, and thus, a column-directional line mura defect can be removed and further, the aperture ratio can be improved.

Further, according to an embodiment of the present disclosure, the two gate lines intersect each other in the pixel border area, such that a charge amount of the capacitor between the gate node of the driving transistor and the gate line in the odd-numbered pixel can be equal to a charge amount of the capacitor between the gate node of the driving transistor and the gate line in the even-numbered pixel regardless of overload (OVL) fluctuation.

Furthermore, according to an embodiment of the present disclosure, the two gate lines intersect each other in the pixel border area, such that a distance between the gate node of the driving transistor and the gate line in the odd-numbered pixel can be equal to a distance between the gate node of the driving transistor and the gate line in the even-numbered pixel regardless of overload (OVL) fluctuation.

According to an embodiment of the present disclosure, the asymmetric structure due to the conventional flip structure is removed in that the odd and even-numbered pixels are arranged in a non-flip manner with each other. Thus, the capacitance between the gate node of the driving transistor and the gate line in the odd-numbered pixel can be equal to the capacitance between the gate node of the driving transistor and the gate line in the even-numbered pixel regardless of overload (OVL) fluctuation. This can remove use of a variation prevention structure, so that the aperture ratio can be increased due to increase in a circuit area density.

According to an embodiment of the present disclosure, a structure is provided to minimize the increase in the load on the gate node of the driving transistor of each pixel, and the aperture ratio can be improved by about 3% compared to the conventional flip structure. Further, the luminance difference depending on the consecutive arrangement of the gate lines can be reduced.

According to an embodiment of the present disclosure, an area of the white sub-pixel can be increased such that a 2-scan structure capable of driving the 4 sub-pixels (normal 4-sub pixels) in the DRD (double rate driving) scheme can be formed.

According to an embodiment of the present disclosure, high-efficiency, and high-luminance pixel operation can be achieved using the 4 sub-pixels operation, so that the display panel can operate at a low power level.

According to an embodiment of the present disclosure, a display panel that improves the aperture ratio and facilitates a repair design can be provided.

According to an embodiment of the present disclosure, since the light-emitting area that generates white light is not continuous but is broken, the image can be reproduced on the display panel without white horizontal or vertical stripes, thereby improving display quality.

According to an embodiment of the present disclosure, neighboring pixels can operate in the 4 sub-pixels manner and the 3 sub-pixels manner alternately with each other to increase the luminance of the image reproduced on the display panel and improve the color gamut.

According to an embodiment of the present disclosure, the light-emitting area of the white sub-pixel can be increased without bending a wiring pattern.

According to an embodiment of the present disclosure, the pixel circuits for driving the sub-pixels emitting light of the same color are adjacent to each other in the left-right direction in the horizontal direction without the light-emitting area being interposed therebetween, such that the decrease in the aperture ratio due to the repair pattern disposed therebetween can be prevented.

According to an embodiment of the present disclosure, the color gamut can be improved such that the display quality can be improved. The lifespan of the display panel can be prevented from being reduced.

According to an embodiment of the present disclosure, improving the display quality can lead to reducing of the power consumption and improving of the lifespan.

According to an embodiment of the present disclosure, reducing of the power consumption can lead to improving of the lifespan, thereby providing a long-life display device.

The display device according to aspects of the present disclosure can reduce the power consumption to prevent the lifespan of the display panel from being lowered, and to improve the display quality of the display device.

Effects of the present disclosure are not limited to the effects mentioned above, and other effects not mentioned will be clearly understood by those skilled in the art from the description below.

In addition to the above effects, specific effects of the present disclosure are described together while describing specific details for carrying out the present disclosure.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
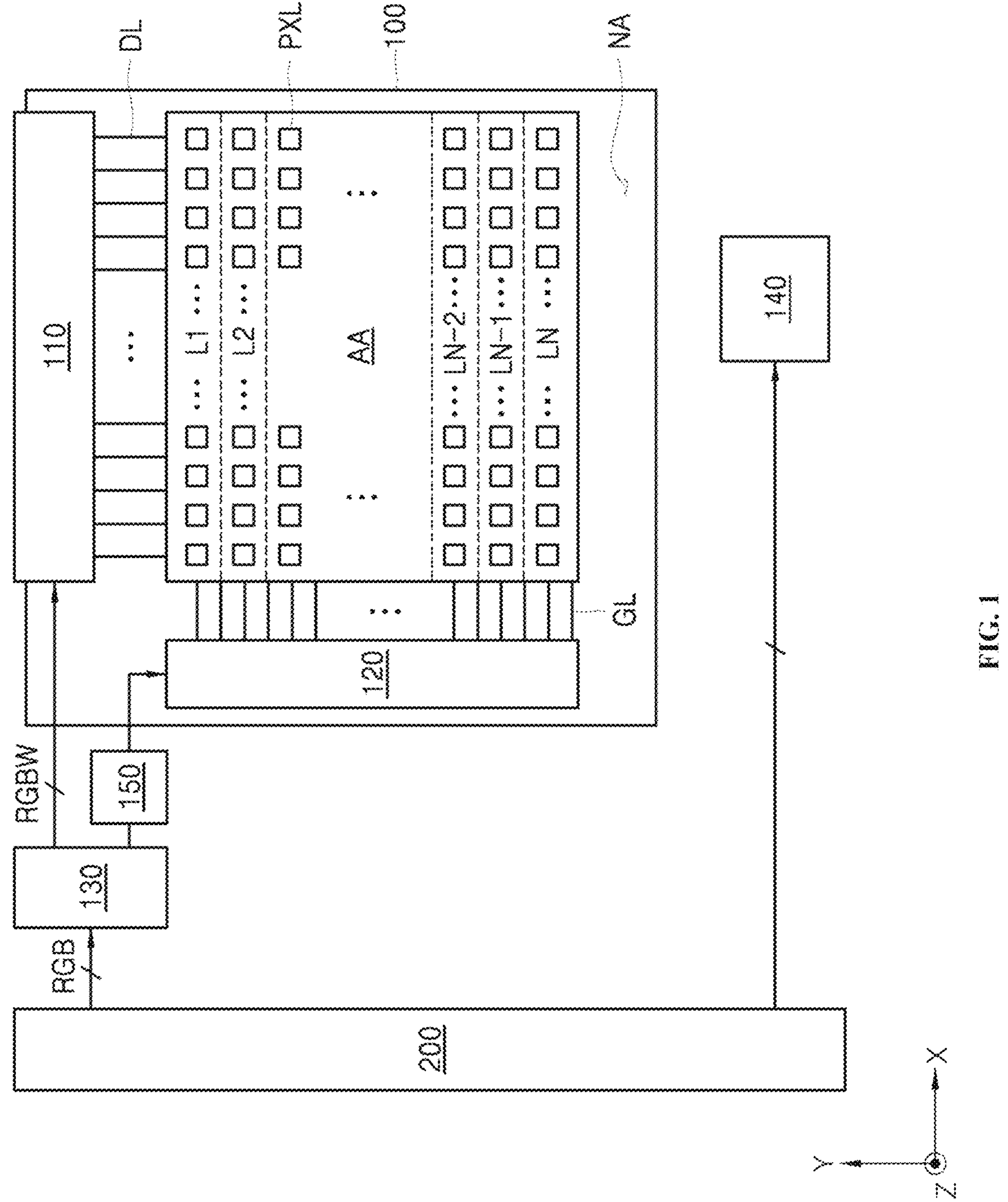
FIG. 1 is a diagram schematically showing a configuration of a display device according to one or more embodiments of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but can be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this disclosure, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements can modify the entire list of elements and may not modify the individual elements of the list. In interpretation of numerical values, an error or tolerance therein can occur even when there is no explicit description thereof. Further, the term "can" fully encompasses all the meanings and coverages of the term "may."

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "connected to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is not indicated.

When a certain embodiment can be implemented differently, a function or an operation specified in a specific block can occur in a different order from an order specified in a flowchart. For example, two blocks in succession can be actually performed substantially concurrently, or the two blocks can be performed in a reverse order depending on a function or operation involved.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section as described under could be termed a second element, component, region, layer or section, without departing from the spirit and scope of the present disclosure.

When an embodiment can be implemented differently, functions or operations specified within a specific block can be performed in a different order from an order specified in a flowchart. For example, two consecutive blocks can actually be performed substantially simultaneously, or the blocks can be performed in a reverse order depending on related functions or operations.

The features of the various embodiments of the present disclosure can be partially or entirely combined with each other, and can be technically associated with each other or operate with each other. The embodiments can be implemented independently of each other and can be implemented together in an association relationship.

In interpreting a numerical value, the value is interpreted as including an error range unless there is no separate explicit description thereof.

It will be understood that when an element or layer is referred to as being "connected to", or "connected to" another element or layer, it can be directly on, connected to, or connected to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. For example, unless otherwise stated or clear from the context, the expression that 'x uses a or b' means any one of natural inclusive permutations.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term can be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

In description of flow of a signal, for example, when a signal is delivered from a node A to a node B, this can include a case where the signal is transferred from the node A to the node B via another node unless a phrase 'immediately transferred' or 'directly transferred' is used.

Throughout the present disclosure, "A and/or B" means A, B, or A and B, unless otherwise specified, and "C to D" means C inclusive to D inclusive unless otherwise specified.

"At least one" should be understood to include any combination of one or more of listed components. For example, at least one of first, second, and third components means not only a first, second, or third component, but also all combinations of two or more of the first, second, and third components.

Hereinafter, embodiments of the present disclosure will be described using the attached drawings. A scale of each of components as shown in the drawings is different from an actual scale thereof for convenience of illustration, and therefore, the present disclosure not limited to the scale as shown in the drawings.

Hereinafter, a display panel having an improved aperture ratio of each pixel and a display device including the same according to some embodiments of the present disclosure will be described. All the components of each display device according to all embodiments of the present disclosure are operatively coupled and configured.

FIG. 1 is a diagram schematically showing a configuration of a display device according to one or more embodiments of the present disclosure.

Referring to FIG. 1, the display device according to one or more embodiments of the present disclosure can include a display panel 100, a display panel driving circuit for writing pixel data to pixels of the display panel 100, and a power supply 140 that generates power necessary for driving the pixels and the display panel driving circuit.

The display panel 100 can include a display area (Active Area) AA and a non-display (Non-active Area) NA. The non-display area NA can surround the display area AA entirely or only in part(s).

The display panel 10 can include a substrate and a plurality of sub-pixels disposed on the substrate. Furthermore, the display panel 100 can further include various types of signal lines to drive the plurality of sub-pixels.

The display area AA can include a plurality of data lines DL conveying data signals, (also referred to as data voltages, or image signals), and a plurality of gate lines GL conveying gate signals (also referred to as scan signals).

A plurality of data lines and a plurality of gate lines can intersect each other. Each of the plurality of data lines can extend in a second direction (e.g., Y direction). Each of the plurality of gate lines can extend in a first direction (e.g., X direction). In this regard, the first direction can be a row direction, and the second direction can be a column direction. Alternatively, the first direction can be a column direction, and the second direction can be a row direction. The first and second directions can be perpendicular to each other or may be intersecting directions.

The non-display area NA can be an area outside the display area AA and can include a bezel area. An entirety or a portion of the non-display area NA can be an area visible from a viewer in front of the display device, or can be an area that is bent backwardly and thus is not visible from the viewer in front of the display device.

The display panel 100 can be a panel with a rectangular structure having a length in the X-axis direction or the first direction, a width in the Y-axis direction or the second direction, and a thickness in a Z-axis direction or a third direction. The X-axis and Y-axis can be straight axes orthogonal to each other and can define a XY plane. The display area AA of the display panel 100 includes a pixel array that displays an input image. The pixel array includes a plurality of data lines DL, a plurality of gate lines GL that intersect the data lines DL, and pixels arranged in a matrix form. The display panel 100 includes power lines commonly connected to the pixels. The power lines can be connected to constant voltage nodes of pixel circuits and supply a constant voltage necessary to drive the pixels PXL to the pixels PXL. The power lines can be embodied as stripe or mesh wirings and can be commonly connected to the pixels of the display panel 100.

Each of the pixels PXL includes a first sub-pixel, a second sub-pixel, a third sub-pixel, and a fourth sub-pixel for respectively emitting light of different colors for color display. An arrangement of the first sub-pixel, the second sub-pixel, the third sub-pixel, and the fourth sub-pixel for respectively emitting light of different colors can vary. The first sub-pixel can be a blue (B) sub-pixel, the second sub-pixel can be a green (G) sub-pixel, the third sub-pixel can be a red (R) sub-pixel, and the fourth sub-pixel can be a white (W) sub-pixel. However, embodiments of the present disclosure are not limited thereto. Each sub-pixel includes a pixel circuit for driving a light-emitting element. Each pixel circuit is connected to a data line, gate lines, and power lines. An area of each sub-pixel can be divided into a circuit area and a light-emitting area. The pixel circuit is disposed in the circuit area. The light-emitting area is an area where light is emitted from the light-emitting element electrically connected to the pixel circuit.

The pixel array includes a plurality of pixel rows L1 to LN, where N can be a real number such as a positive integer greater than 1. Each of the pixel rows L1 to LN includes one row of pixels arranged along a row direction (the X-axis direction) in the pixel array of the display panel 100. The pixels arranged in one pixel row share the same gate line GL. The sub-pixels arranged in the column direction Y along a data line direction share the same data line DL. One horizontal period amounts to a time divided by one frame period by a total number of pixel rows L1 to LN.

The power supply 140 uses a DC-DC converter to output the voltage necessary to drive the pixels of the display panel 100 and a display panel driving circuit. The DC-DC converter can include a charge pump, a regulator, a buck converter, a boost converter, etc.

The display panel driving circuit writes pixel data of the input image to the pixels of the display panel 100 under control of a timing controller 130. The display panel driving circuit includes a data driver 110 and a gate driver 120.

The display panel driving circuit can drive the pixels in a DRD (Double Rate Driving) scheme. In the display panel operating in the DRD scheme, the data line DL can be connected to sub-pixels adjacent to each other in a left-right direction, thereby reducing the number of channels of the data driver 110 and the number of data lines DL. This is advantageous in securing an aperture ratio of the pixel.

The display panel driving circuit can further include a touch sensor driver to drive touch sensors. The touch sensor driver is omitted in FIG. 1. The data driver 110 and the touch sensor driver can be integrated into one source drive IC (Integrated Circuit).

The data driver 110 receives pixel data of the input image received as a digital signal from the timing controller 130 and outputs a data voltage based on the pixel data. The data driver 110 can use a DAC (Digital to Analog Converter) to convert the pixel data of the input image into a gamma compensated data voltage and to output the gamma compensated data voltage every frame period. The gamma compensated data voltage is output through an output buffer from each channel of the data driver 110.

The gate driver 120 along with a TFT array of the pixel array and wirings can be formed in the display panel 100. The gate driver 120 can be disposed in the non-display area NA of the display panel 100, or at least a portion of the gate driver 120 can be disposed within the display area AA where the input image is reproduced.

The gate drivers 120 can be respectively disposed in the non-display area NA on each of both opposing sides of the display panel 100 while the display area AA of the display panel 100 is disposed therebetween, and can be disposed respectively on both opposing ends of the gate lines GL and thus can supply gate pulses to the gate lines GL in a double feeding scheme. In another embodiment, the gate driver 120 can be disposed on either the left or right non-display area NA of the display panel 100 and can supply the gate signal to the gate lines GL in a single feeding scheme. The gate driver 120 sequentially outputs pulses of the gate signals to the gate lines under control of the timing controller 130. The gate driver 120 can sequentially supply the gate signals to the gate lines GL by shifting the pulse (hereinafter, referred to as the gate pulse) of the gate signal using the shift register. The gate driver 120 can include a plurality of shift registers that output the pulses of the gate signals.

The timing controller 130 receives digital video data of the input image and a timing signal synchronized with the digital video data from the host system 200. The timing signal can include a vertical synchronization signal, a horizontal synchronization signal, a clock, and a data enable signal, etc. Since a vertical period and a horizontal period can be known by counting the data enable signal, the vertical synchronization signal and the horizontal synchronization signal can be omitted. The data enable signal has a period of 1 horizontal period (1H). The timing controller 130 generates a data timing control signal to control an operation timing of the data driver 110 and a gate timing control signal to control an operation timing of the gate driver 120, based on the timing signal received from the host system 200.

The timing controller 130 can add white data to three primary color pixel data RGB input from the host system to obtain four color sub-color data RGBW, and transmit the four color sub-color data RGBW to the data driver 110. A scheme of converting the three primary color pixel data RGB to the four sub-color data RGBW including the white color data can include a known color conversion algorithm. For example, the timing controller 130 can generate W data of first pixel data by mixing R data, G data, and B data of the first pixel data, as received as the data of the input image and based on a minimum grayscale value among the grayscale values of the R data, G data, and B data, and can convert the primary color pixel data RGB to the four sub-color data RGBW based on the generated W data. Furthermore, the timing controller 130 can generate W data of second pixel data by mixing R data, G data, and B data of the second pixel data, as received as the data of the input image and based on a minimum grayscale value among the grayscale values of the R data, G data, and B data, and can convert the primary color pixel data RGB to the four sub-color data RGBW based on the generated W data. Thus, in each of the first and second pixel data, the grayscale values of the R, G, and B data can be lowered by the grayscale value of the W data. In this regard, the R data can be data to be written in the red sub-pixel, the G data can be data to be written in the green sub-pixel, the B data can be data to be written in the blue sub-pixel, and the W data can be data to be written in the white sub-pixel.

The level shifter 150 can receive a gate timing control signal from the timing controller 130 and generate a start pulse and a shift clock based on the gate timing control signal, and provide the start pulse and the shift clock to the gate driver 120. The start pulse and the shift clock output from the level shifter 150 swing between a gate high voltage and a gate low voltage.

The host system 200 can include a main board of any one of a TV (television) system, a set-top box, a navigation system, a personal computer (PC), a vehicle system, a mobile terminal, and a wearable terminal. The host system can scale the image signal from the video source to match a resolution of the display panel 100 and transmit the scaled image signal along with the timing signal to the timing controller 130.

The display device according to some embodiments of the present disclosure can be a liquid crystal display device, etc. or can be a self-light-emitting display device including the display panel 100 that emits light on its own. When the display device according to some embodiments of the present disclosure is the self-light-emitting display device, each of the plurality of sub-pixels can include a light-emitting element.

For example, the display device according to some embodiments of the present disclosure can be an organic light-emitting display device in which the light-emitting element is embodied as an organic light-emitting diode (OLED). In another example, the display device 100 according to some embodiments of the present disclosure can be an inorganic light-emitting display device in which the light-emitting element is embodied as an inorganic-based light-emitting diode. In still another example, the display device 100 according to some embodiments of the present disclosure can be a quantum dot display device in which a light-emitting element is embodied as a quantum dot as a semiconductor crystal that emits light on its own.

Depending on the type of the display device, a structure of each of the plurality of sub-pixels can vary. For example, when the display device 100 is the self-light-emitting display device in which the sub-pixels emit light on their own, each sub-pixel can include a self-emitting light-emitting element, one or more transistors, and one or more capacitors.

For not only an image display function but also a touch sensing function, the display device according to some embodiments of the present disclosure can include a touch sensor for sensing a touch on a touch panel by a touch object such as a finger or pen, and a touch sensing circuit configured to detect absence or presence of the touch, or a touch location based on the sensing result from the touch sensor.

The touch sensing circuit can include a touch driving circuit that drives the touch sensor to generate and output touch sensing data, and a touch controller that can detect occurrence of the touch or detect the location of the touch using touch sensing data.

The touch sensor can include a plurality of touch electrodes. The touch sensor can further include a plurality of touch lines to electrically connect the plurality of touch electrodes and the touch driving circuit to each other.

The touch sensor can be provided in a form of a touch panel and can be disposed outside the display panel 100, or can be disposed inside the display panel 100.

When the touch sensor is disposed outside the display panel 100 in the form of the panel, the touch sensor can be referred to an external touch sensor. When the touch sensor is embodied as the external touch sensor, the touch panel and the display panel 100 can be manufactured separately and can be combined with each other during the assembly process. The external touch panel can include a touch panel substrate and a plurality of touch electrodes on the touch panel substrate.

When the touch sensor is present inside the display panel 100, the touch sensor along with signal lines and electrodes related to display driving can be formed on a substrate SUB during the manufacturing process of the display panel 100.

The touch driving circuit can supply a touch driving signal to at least one of the plurality of touch electrodes to sense the touch on the touch panel to generate touch sensing data and can receive the touch sensing data therefrom.

The touch sensing circuit can perform touch sensing using a self-capacitance sensing scheme or a mutual-capacitance sensing scheme.

When the touch sensing circuit performs the touch sensing using the self-capacitance sensing scheme, the touch sensing circuit can perform the touch sensing based on the capacitance between each touch electrode and a touch object, such as a finger or a touch pen.

According to the self-capacitance sensing scheme, each of the plurality of touch electrodes can serve as a driving touch electrode and a sensing touch electrode. The touch driving circuit can drive an entirety or some of the plurality of touch electrodes and can receive the touch sensing data from the entirety or some of the plurality of touch electrodes.

When the touch sensing circuit performs touch sensing using a mutual-capacitance sensing scheme, the touch sensing circuit can perform touch sensing based on the capacitance between touch electrodes.

According to the mutual-capacitance sensing scheme, the plurality of touch electrodes can be divided into driving touch electrodes and sensing touch electrodes. The touch driving circuit can drive the driving touch electrodes and sense the sensing touch electrodes.

The touch driving circuit and the touch controller included in the touch sensing circuit can be embodied as separate components, and can be integrated into a single component. Furthermore, the touch driving circuit and the data driver 110 can be embodied as separate components, or can be integrated into a single component.

The display device according to some embodiments of the present disclosure can be included in the mobile terminal device such as smart phones and tablets, or monitors or televisions of various sizes. However, embodiments of the present disclosure are not limited thereto. The display device according to some embodiments of the present disclosure can be of various types and sizes capable of displaying information or images.

Figure 2:
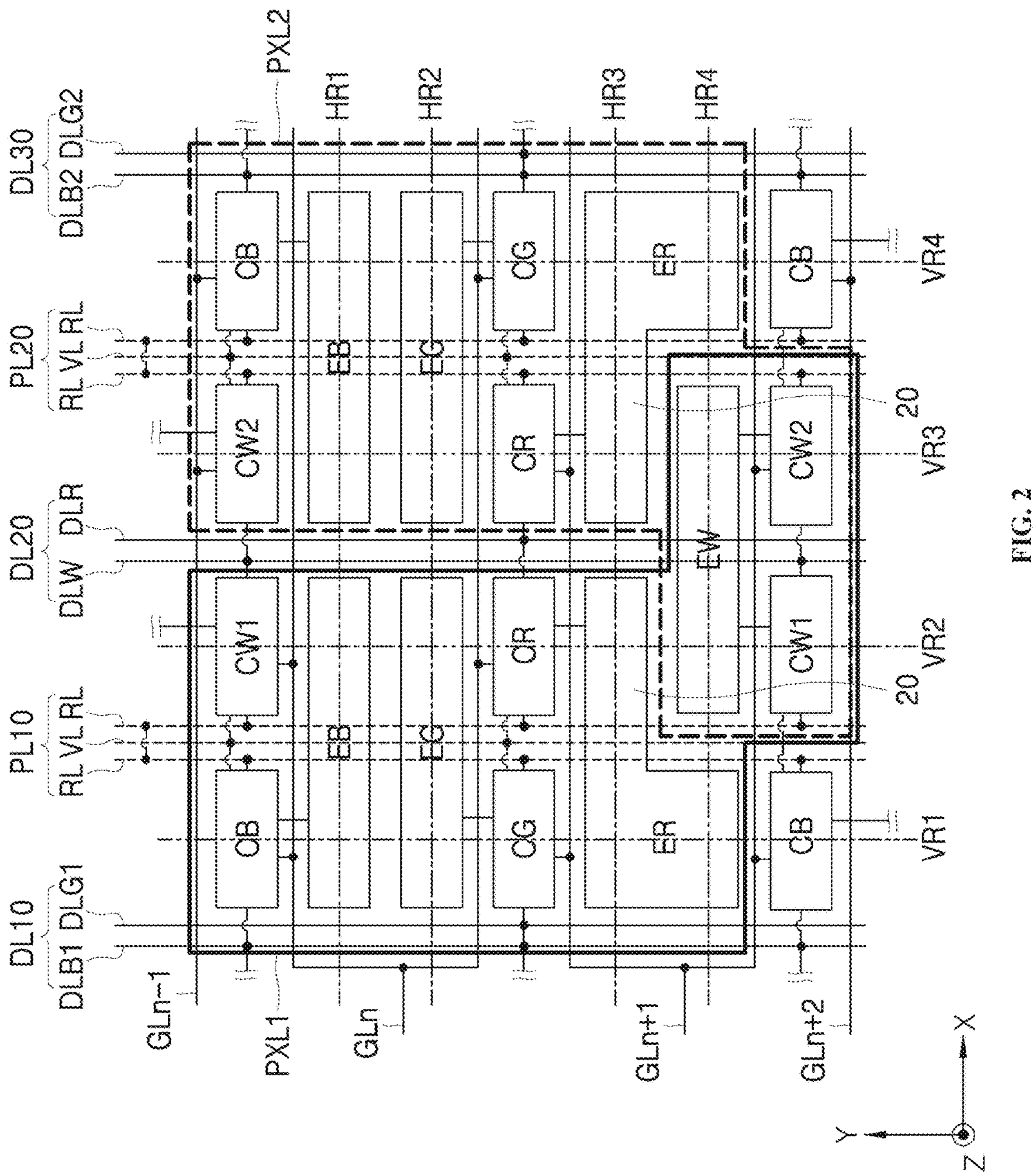
FIG. 2 is a diagram schematically showing first and second pixels according to an embodiment of the present disclosure.

FIG. 2 is a diagram schematically showing first and second pixels according to an embodiment of the present disclosure. The pixels of the display panel can be arranged in a manner such that the first and second pixels are repeatedly arranged.

Referring to FIG. 2, the display panel 100 can include the first and second pixels PXL1 and PXL2 that are arranged in a left-right mirror symmetrical structure with each other around the Y-axis, and are adjacent to each other in the X-axis direction as the first direction.

Each of the first pixel PXL1 and the second pixel PXL2 can include a first sub-pixel, a second sub-pixel, and a third sub-pixel for respectively emitting light of different colors.

The first pixel PXL1 and the second pixel PXL2 can share the white sub-pixel.

The display panel 100 includes a first data line pair DL10 disposed on the left side of the first pixel PXL1 and extending in the Y-axis direction, a second data line pair DL20 disposed between the first pixel PXL1 and the second pixel PXL1 and extending in the Y-axis direction, a third data line pair DL30 disposed on the right side of the second pixel PXL2 and extending in the Y-axis direction, a first power line PL10 disposed between the first data line pair DL10 and the second data line pair DL20 and extending in the Y-axis direction, and a second power line PL20 disposed between the second data line pair DL20 and the third data line pair DL30 and extending in the Y-axis direction.

Each of the first power line PL10 and the second power line PL20 can include a plurality of first power wirings (lines) VL to which a pixel driving voltage EVDD is applied, and a second power wiring (line) RL to which a reference voltage Vref is applied. The plurality of first power wirings (lines) VL can be respectively disposed on both opposing sides of the second power wiring (line) RL and connected to each other. A width of each of the plurality of first power wirings (lines) VL can be larger than a width of the second power wiring (line) RL.

In FIG. 2, a first vertical reference line VR1 is an imaginary line parallel to the Y-axis direction and disposed between the first data line pair DL10 and the first power line PL10. A second vertical reference line VR2 is an imaginary line parallel to the Y-axis direction and disposed between the first power line PL10 and the second data line pair DLW and DLR. A third vertical reference line VR3 is an imaginary line parallel to the Y-axis direction and disposed between the second data line pair DLW and DLR and the second power line PL2. A fourth vertical reference line VR4 is an imaginary line parallel to the Y-axis direction and disposed between the second power line PL2 and the third data line pair DL30.

The first pixel PXL1 includes a blue sub-pixel, a green sub-pixel, and a red sub-pixel arranged along the Y-axis direction such that the virtual first and second vertical reference lines VR1 and VR2 extend through the blue sub-pixel, the green sub-pixel, and the red sub-pixel. The second pixel PXL2 includes a blue sub-pixel, a green sub-pixel, and a red sub-pixel arranged along the Y-axis direction such that the third virtual and fourth vertical reference lines VR3 and VR4 extend through the blue sub-pixel, the green sub-pixel, and the red sub-pixel. The blue sub-pixels of the first and second pixels PXL1 and PXL2 are separated and spaced from each other. The green sub-pixels of the first and second pixels PXL1 and PXL2 are separated and spaced from each other. The red sub-pixels of the first and second pixels PXL1 and PXL2 are separated and spaced from each other. Independent R data can be individually written into the first and second pixels PXL1 and PXL2. Independent G data can be individually written into the first and second pixels PXL1 and PXL2. Independent B data can be individually written into the first and second pixels PXL1 and PXL2.

The first and second pixels PXL1 and PXL2 share the white sub-pixel. A light-emitting area EW of the white sub-pixel includes an area where the second and third vertical reference lines VR2 and VR3 and a virtual fourth horizontal reference line HR4 intersect each other.

Each of the first and second pixels PXL1 and PXL2 can operate in a 4 sub-pixels manner or at a 3 sub-pixels manner. In the 4 sub-pixels manner, the 4 sub-pixels include a red sub-pixel, a green sub-pixel, a blue sub-pixel, and a shared white sub-pixel. In the 3 sub-pixels manner, the 3 sub-pixels include a red sub-pixel, a green sub-pixel, and a blue sub-pixel, excluding the white sub-pixel.

When the first pixel PXL1 operates in the 4 sub-pixels manner, the W data generated based on the R, G, and B data of the first pixel PXL1 is written to the white sub-pixel. When the second pixel PXL2 operates in the 4 sub-pixels manner, the W data generated based on the R, G, and B data of the second pixel PXL2 is written to the white sub-pixel.

Each of the first and second pixels PXL1 and PXL2 can operate in a hybrid manner. For example, when the first pixel PXL1 operates in the 4 sub-pixels manner, the second pixel PXL2 can operate in the 3 sub-pixels manner. When the second pixel PXL2 operates in the 4 sub-pixels manner, the first pixel PXL1 can operate in the 3 sub-pixels manner.

The timing controller 130 can analyze whether the input image is based on a pure color or analyze a saturation of the input image. When the saturation is greater than or equal to a predetermined reference value, the timing controller 130 can control the first and second pixels PXL1 and PXL2 to operate in the 3 sub-pixels manner at the same time. In this case, the white sub-pixel does not operate.

The blue sub-pixel includes a first pixel circuit CB and a first light-emitting area EB that is connected to the first pixel circuit CB and emits blue light. The green sub-pixel includes a second pixel circuit CG and a second light-emitting area EG that is connected to the second pixel circuit CG and emits green light. The red sub-pixel includes a third pixel circuit CR and a third light-emitting area ER that is connected to the third pixel circuit CR and emits red light. The white sub-pixel includes fourth pixel circuits CW1 and CW2 disposed respectively in the first and second pixels, and a fourth light-emitting area EW which is connected to the fourth pixel circuits CW1 and CW2 and emits white light. An anode electrode of a light-emitting element EL can be disposed in each of the light-emitting areas EB, EG, ER, EW1 and EW2. Each of the pixel circuits CB, CG, CR, CW1, and CW2 can be connected to the anode electrode of corresponding one of the light-emitting areas EB, EG, ER, EW1 and EW2. When current is generated from a driving element of the pixel circuit, the light-emitting area can emit light. The (4-1)-st light-emitting area EW1 is connected to the (4-1)-st pixel circuit CW1. The (4-2)-nd light-emitting area EW2 is connected to the (4-2)-nd pixel circuit CW2.

Figure 3:
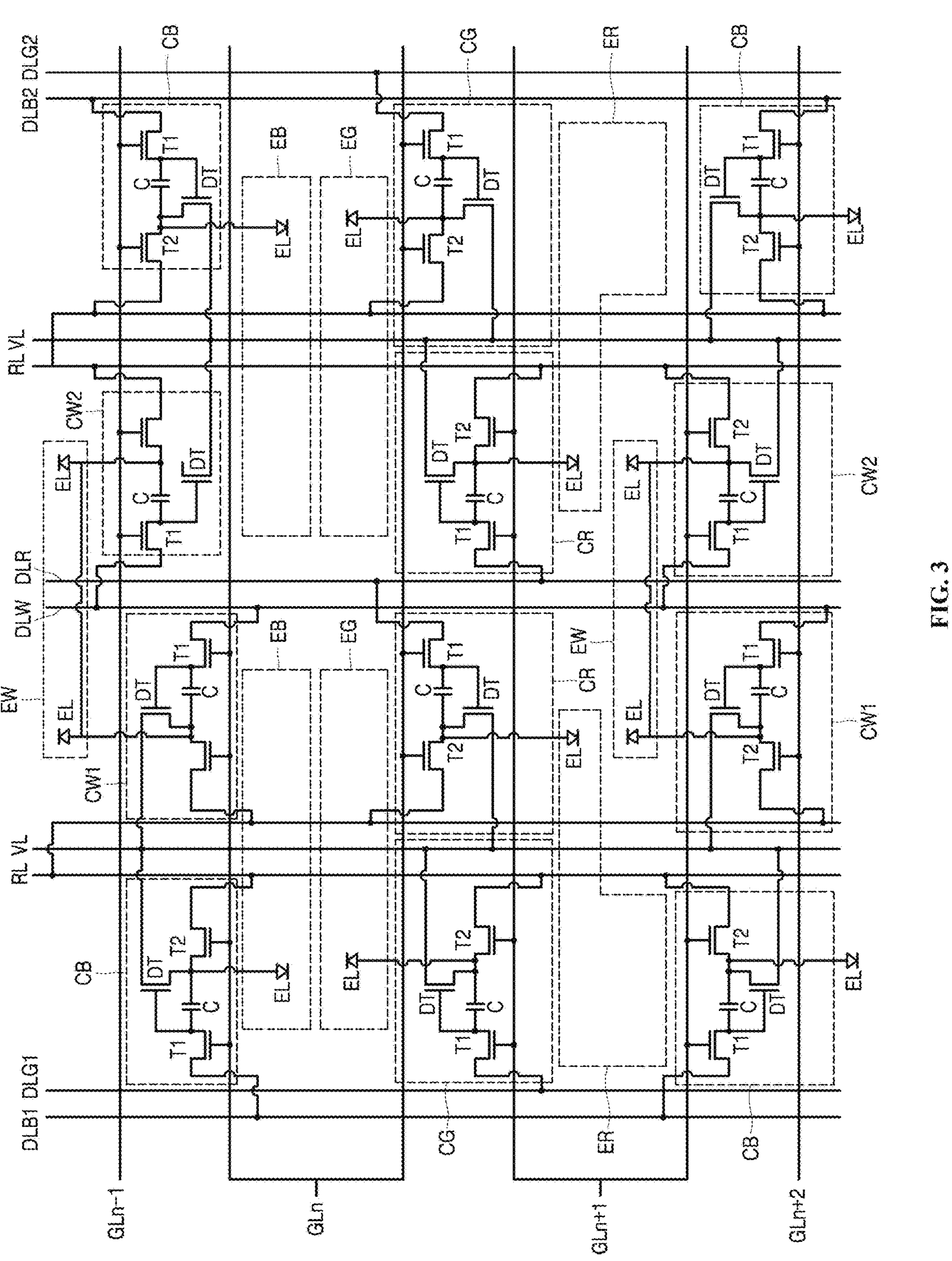
FIG. 3 is an equivalent circuit diagram showing in detail an example of pixel circuits as shown in FIG. 2.

In the white sub-pixel, the fourth light-emitting area EW can operate under control of at least one of the fourth pixel circuits CW and CW2. The (4-1)-st pixel circuit CW1 and the (4-2)-nd pixel circuit CW2 can be connected to different gate lines as shown in FIG. 3 and can receive the gate pulse sequentially and can drive the light-emitting element of the white sub-pixel. In this regard, it is shown in FIG. 2 that the fourth light-emitting area EW is shared by the first and second pixels PXL1 and PXL2. However, embodiments of the present disclosure are not limited thereto. In this regard, the fourth light-emitting area EW can include a (4-1)-st light-emitting area EW1 and a (4-2)-nd light-emitting area EW2. In this regard, each of the first and second pixels PXL1 and PXL2 can share the (4-1)-st light-emitting area EW1 and the (4-2)-nd light-emitting area EW2.

In the first pixel PXL1, the first pixel circuit CB, the left portion of the first light-emitting area EB, the left portion of the second light-emitting area EG, the second pixel circuit CG, and the left portion of the third light-emitting area ER are arranged along the first vertical reference line VR1 in this order.

In the first pixel PXL1, the (4-1)-st pixel circuit CW1, the right portion of the first light-emitting area EB, the right portion of the second light-emitting area EG, the third pixel circuit CR, the right portion of the third light-emitting area ER, and the (4-1)-st light-emitting area EW1 are arranged along the second vertical reference line VR2 in this order.

In the second pixel PXL2, the (4-2)-nd pixel circuit CW2, the left portion of the first light-emitting area EB, the left portion of the second light-emitting area EG, the third pixel circuit CR, the left portion of the third light-emitting area ER, the (4-2)-nd light-emitting area EW2 are arranged along the third vertical reference line VR3 in this order.

In the second pixel PXL2, the first pixel circuit CB, the right portion of the first light-emitting area EB, the right portion of the second light-emitting area EG, the second pixel circuit CG, and the right portion of the third light-emitting area ER are arranged along the fourth vertical reference line VR4 in this order.

An arrangement of the light-emitting areas of the different colors in the first pixel PXL1 along the Y-axis direction can be identical with an arrangement of the light-emitting areas of the different colors in the second pixel PXL2 along the Y-axis direction. The light-emitting areas of the same color of in the first pixel PXL1 and the second pixel PXL2 are arranged along the X-axis direction. For example, the first light-emitting areas EB of the first and second pixels PXL1 and PXL2 are arranged along and overlap the virtual first horizontal reference line HR1 parallel to the X-axis direction. The second light-emitting areas EG of the first and second pixels PXL1 and PXL2 are arranged with the first light-emitting areas EB in the Y-axis direction and are arranged in and overlap a virtual second horizontal reference line HR2 parallel to the X-axis direction. The third light-emitting areas ER of the first and second pixels PXL1 and PXL2 are arranged with the second light-emitting areas EG in the Y-axis direction and are arranged in and overlap a virtual third horizontal reference line HR3 parallel to the X-axis direction. The lower portion of the third light-emitting areas ER and the fourth light-emitting areas EW1 and EW2 of the first and second pixels PXL1 and PXL2 are arranged in the virtual fourth horizontal reference line HR4 arranged in the third horizontal reference line HR3 in the Y-axis direction. In this regard, the first to fourth horizontal reference lines HR1 to HR4 are arranged in the Y-axis direction in this order. To improve the color gamut, a size of the third light-emitting area ER which generates red light can be larger than each of the first and second light-emitting areas EB and EG.

The fourth light-emitting area EW which generates white light is not continuous in the display panel 100 and thus is disposed in a broken or discontinuous manner on a pixel basis. This can prevent the white horizontal or vertical stripe from being visible to the viewer when an entire display area AA of the display panel 100 displays a single color or a specific gray level.

The third light-emitting area ER can be an 'L' shaped light-emitting area in which one ¼ corner portion has been removed from a rectangle. The upper portion in the column direction of the third light-emitting area ER includes a small width portion 20 adjacent to an upper end in the column direction of the fourth light-emitting area EW. The fourth light-emitting area EW is disposed in an area secured by removing a portion (overlapping the portion 20 in the column direction) of a lower portion in the column direction of the red light-emitting area ER of the first pixel PXL1 and a portion of (overlapping the portion 20 in the column direction) of a lower portion of the red light-emitting area ER of the second pixel PXL1 which are arranged in a left and right mirror symmetrical manner with each other around the second data line pair DL. In a plan view, upper, left and right sides of the fourth light-emitting area EW are surrounded with the third light-emitting areas ER of the first and second pixels PXL1 and PXL2. The third and fourth pixels PXL3 and PXL4 are arranged in the X-axis direction. The third pixel PXL3 and the first pixel PXL1 are arranged in the Y-axis direction. The fourth pixel PXL3 and the second pixel PXL2 are arranged in the Y-axis direction. For example, the first light-emitting areas EB of the third and fourth pixels PXL3 and PXL4 are disposed under the fourth light-emitting area EW of the first and second pixels PXL1 and PXL2. The third and fourth pixels PXL3 and PXL4 are adjacent to each other in the X-axis direction. Therefore, the fourth light-emitting area EW of the first and second pixels PXL1 and PXL2 are not adjacent to the fourth light-emitting area EW of the third and fourth pixels PXL3 and PXL4.

The power lines PL10 and PL20 can supply a constant voltage necessary for driving the pixels PXL1 and PX2 to the pixel circuits CB, CG, CR, CW1, and CW2. The pixel driving voltage can be applied to the EVDD power line VL, and a reference voltage can be applied to the REF power line RL. The REF power line RL is disposed between the EVDD power lines VL having a relatively larger width. The EVDD power lines VL are connected to the pixel circuits CB, CG, CR, CW1, and CW1 adjacent thereto and supply the pixel driving voltage to the pixel circuits CB, CG, CR, CW1, and CW1. The REF power line RL can be disposed in the non-display area NA. The REF power line VR can be connected to the pixel circuits CB, CG, CR, CW1, and CW1 adjacent thereto and supply the pixel driving voltage to the pixel circuits CB, CG, CR, CW1, and CW1.

In each of the first and second pixels PXL1 and PXL2, the power lines VL and RL can extend across the first light-emitting area EB, the second light-emitting area EG, and the third light-emitting area ER in an overlapping manner with the first light-emitting area EB, the second light-emitting area EG, and the third light-emitting area ER. The power lines VL and RL can bypass the fourth light-emitting areas EW1 and EW2 and do not overlap with the fourth light-emitting areas EW1 and EW2.

The first data line pair DL10 includes a first data line DLB1 to which a data voltage of the B data is applied, and a second data line DLG1 to which a data voltage of the G data is applied. The first data line DLB1 is commonly connected to the first pixel circuits CB of the pixels adjacent thereto in the X-axis direction while the first data line DLB1 is disposed therebetween. The first data line DLB1 supplies the data voltage of the B data to the first pixel circuits CB of the pixels adjacent thereto in the X-axis direction while the first data line DLB1 is disposed therebetween. The second data line DLG1 is commonly connected to the second pixel circuits CG of the pixels adjacent thereto in the X-axis direction while the second data line DLG1 is disposed therebetween, and supplies the data voltage of the G data to the second pixel circuits CG of the pixels adjacent thereto in the X-axis direction while the second data line DLG1 is disposed therebetween.

The first data line DLB1 is connected to the plurality of first pixel circuits CB arranged along the Y-axis direction. The first data line DLB1 transmits the data voltage of the B data to be written from the data driver 110 into the blue sub-pixels to the first pixel circuits CB. Only the data voltage of the B data is applied to the first data line DLB1. The second data line DLG1 is connected to the plurality of second pixel circuits CG arranged along the Y-axis direction. The second data line DLG1 transmits the data voltage of the G data to be written from the data driver 110 to the green sub-pixels to the second pixel circuits CG. Only the data voltage of the G data is applied to the second data line DLG1.

The second data line pair DL20 includes a third data line DLR to which the data voltage of the R data is applied, and a fourth data line DLW to which the data voltage of the W data is applied. The third data line DLR is commonly connected to the third pixel circuits CR of the pixels PXL1 and PXL2 adjacent thereto in the X-axis direction while the third data line DLR is disposed between the pixels PXL1 and PXL2, and transmits the data voltage of the R data to the third pixel circuits CR of the pixels PXL1 and PXL2 adjacent thereto in the X-axis direction while the third data line DLR is disposed between the pixels PXL1 and PXL2. The fourth data line DLW is commonly connected to the fourth pixel circuits CW1 and CW2 of the pixels PXL1 and PXL2 adjacent thereto in the X-axis direction while the fourth data line DLW is disposed between the pixels PXL1 and PXL2, and transmits the data voltage of the W data to the fourth pixel circuits CW1 and CW2 of the pixels PXL1 and PXL2 adjacent thereto in the X-axis direction while the fourth data line DLW is disposed between the pixels PXL1 and PXL2.

The third data line DLR is connected to the plurality of third pixel circuits CR arranged along the Y-axis direction. The third data line DLR transmits the data voltage of the R data to be written from the data driver 110 to the red sub-pixels to the third pixel circuits CR. Only the data voltage of the R data is applied to the third data line DLR. The fourth data line DLW is connected to the plurality of fourth pixel circuits CW1 and CW2 arranged along the Y-axis direction. The fourth data line DLW transmits the data voltage of the W data to be written from the data driver 110 into the white sub-pixels to the fourth pixel circuits CW1 and CW2. Only the data voltage of the W data is applied to the fourth data line DLW.

The second data line pair DL20 extends through the fourth light-emitting area EW and overlaps the fourth light-emitting area EW. The second data line pair DL20 can bypass the other light-emitting areas EB, EG, and ER and all of the pixel circuits CB, CG, CR, CW1, and CW2 so as to not overlap therewith.

The third data line pair DL30 includes a fifth data line DLB2 to which the data voltage of the B data is applied and a sixth data line DLG2 to which the data voltage of the G data is applied. The fifth data line DLB2 receives only the data voltage of the B data to be supplied to the blue sub-pixels from the data driver 110. The sixth data line DLG2 receives only the data voltage of the G data to be supplied to the green sub-pixels from the data driver 110. The fifth data line DLB2 is commonly connected to the first pixel circuits CB of the pixels adjacent thereto in the X-axis direction while the fifth data line DLB2 is disposed therebetween, and supplies the data voltage of the B data to the first pixel circuits CB of the pixels adjacent thereto in the X-axis direction while the fifth data line DLB2 is disposed therebetween. The sixth data line DLG2 is commonly connected to the second pixel circuits CG of the pixels adjacent thereto in the X-axis direction while the sixth data line DLG2 is disposed therebetween, and supplies the data voltage of the G data to the second pixel circuits CG of the pixels adjacent thereto in the X-axis direction while the sixth data line DLG2 is disposed therebetween, A plurality of gate lines can extend along the first direction or the X-axis direction. Two gate lines sandwiching two light-emitting areas (EB and EG or ER and EW) respectively emitting light of different colors and adjacent to each other in the second direction Y therebetween can be connected to each other.

Each of the gate lines can extend along each pixel circuit row, and two gate lines adjacent to each other in the second direction Y can be commonly connected to a single output terminal of the gate driver 120. For example, as shown in FIG. 2 and FIG. 3, two gate lines sandwiching two light-emitting areas respectively emitting light of different colors and adjacent to each other in the second direction Y therebetween can be connected to each other and can be connected to the single output terminal of the gate driver 120. Therefore, the gate pulse can be applied to both pixel circuit rows simultaneously. An n-th gate line GL(n) can simultaneously apply a gate pulse to the pixel circuits CB, CG, CR, CW1 and CW2 distributed across the two pixel circuit rows. In FIG. 2, the connection between the pixel circuit CW2 and the n-th gate line GL(n) is omitted. The gate pulse can be applied sequentially to gate lines GL(n)−1 to GL(n)+2 in a following order: GL(n)−1, GL(n), GL(n)+1, and GL(n)+2. Here, n can be a real number such as an integer Each of scan lines SC(n) and SC(n+1) for driving only a sensor transistor T2 of each of the first pixel PXL1 and the second pixel PXL2 can be disposed between the two light-emitting areas respectively emitting light of different colors (EB and EG or ER and EW) and disposed between the two gate lines GL(n) connected to each other.

For example, the n-th scan line SC(n) can be disposed between the first light-emitting area EB and the second light-emitting area EG respectively emitting light of different colors. The (n+1)-st scan line SC(n+1) can be disposed between the third light-emitting area ER and the fourth light-emitting areas EW1 and EW2 respectively emitting light of different colors.

For example, the n-th scan line SC(n) can be disposed between the first light-emitting area EB and the second light-emitting area EG respectively emitting light of different colors arranged in the Y-axis direction and disposed between the two gate lines of the n-th gate line GL(n) extending in the first direction in each of the first pixel PXL1 and the second pixel PXL2.

Furthermore, the (n+1)-st scan line SC(n+1) can be disposed between the third light-emitting area ER and the fourth light-emitting areas EW1 and EW2 respectively emitting light of different colors arranged in the Y-axis direction and disposed between the two gate lines of the (n+1)-st gate line GL(n)+1 extending in the first direction in each of the first pixel PXL1 and the second pixel PXL2.

The first to third light-emitting areas EB, EG, and ER of the first pixel PXL1 and the first to third light-emitting areas EB, EG, and ER of the second pixel PXL2 can be arranged in a mirror symmetrical manner with each other around the second data line pair DL20.

The fourth light-emitting areas EW1 and EW2 can be disposed between the third light-emitting area ER of the first pixel PXL1 and the third light-emitting area ER of the second pixel PXL2 arranged in the first direction X. The third light-emitting area ER can constitute the third sub-pixel, and the fourth light-emitting areas EW1 and EW2 can constitute the white sub-pixel.

A light-emission area size of each of the sub-pixels emitting light of different colors can be appropriately set based on color gamut and high luminance. For example, in an image or a display model in which high luminance is prioritized over the color gamut, the light-emission area size of the fourth light-emitting area EW can be larger, and the driving voltage of each of the three sub-pixels excluding the white sub-pixel can be increased. The structure of the third and fourth light-emitting areas ER and EW as shown in FIG. 2 is configured to make it easy to expand or reduce the size of the fourth light-emitting area EG in an elongate manner extending in parallel to the horizontal reference line. Thus, it can be easy to control the area size of each of the third and fourth light-emitting areas ER and EW without changing the shape of the wirings. In a display model where the pure color is prioritized, for example, the color gamut is prioritized over the high luminance, the area size of the fourth light-emitting area EG can be reduced. In order to increase the luminance, the area size of the fourth light-emitting area EG can increase.

Figure 4:
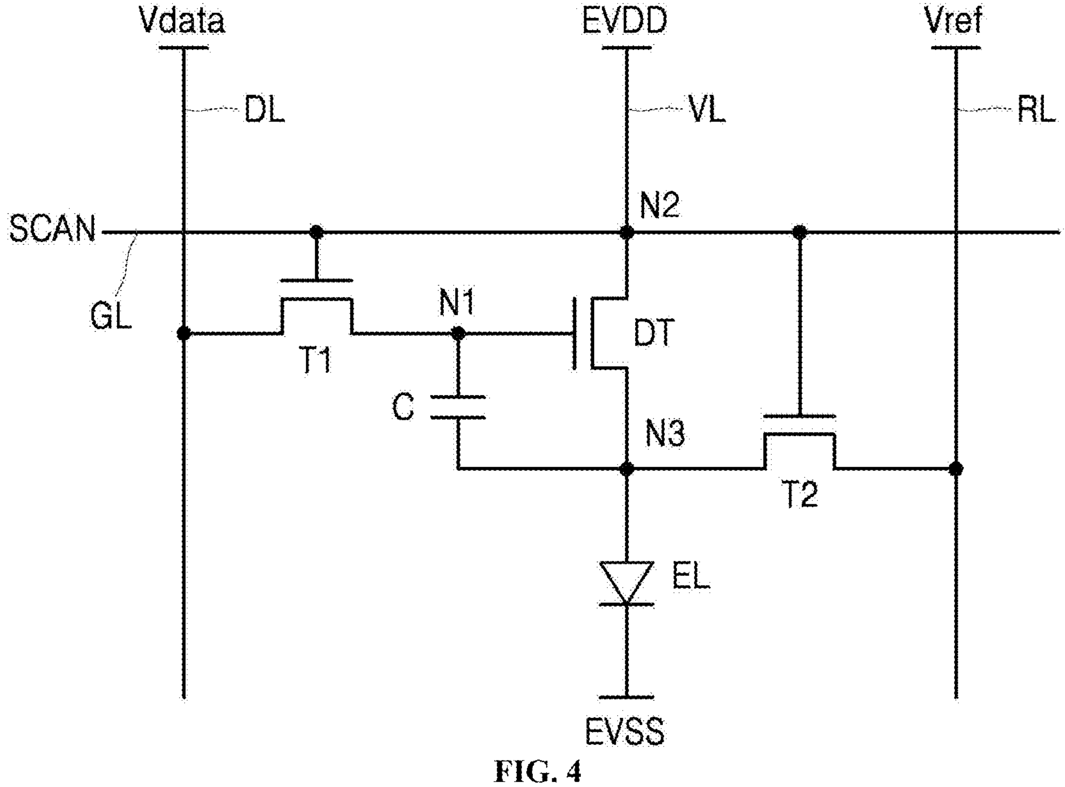
FIG. 4 is a circuit diagram showing an example of a unit pixel circuit.

FIG. 3 is an equivalent circuit diagram showing in detail one example of the pixel circuits as shown in FIG. 2. FIG. 4 is a circuit diagram showing a single pixel circuit.

Referring to FIG. 3 and FIG. 4, each of the pixel circuits CB, CG, CR, CW1, and CW2 is connected to the data line DL to which the data voltage Vdata of pixel data is applied, the gate line GL to which the gate pulse SCAN is applied, the power line VL to which the pixel driving voltage EVDD is applied, a VDD power line to which a cathode voltage EVSS is applied, and the REF power line RL to which the reference voltage Vref is applied.

In the display panel 100, the plurality of gate lines extend along the first direction. The two gate lines sandwiching two light-emitting areas respectively emitting light of different colors and adjacent to each other in the second direction Y therebetween can be connected to each other.

Each of the pixel circuits CB, CG, CR, CW1, and CW2 includes a plurality of transistors DT, T1, and T2, and a capacitor C.

Each of the light-emitting areas can include a light-emitting element EL which can be embodied as the organic light-emitting diode (OLED), or the inorganic light-emitting element such as Micro LED. The light-emitting element EL can include, but is not limited to, a red light-emitting element, a green light-emitting element, and a blue light-emitting element. The anode electrode of the light-emitting element EL is electrically connected to the driving element DT and is disposed in the corresponding light-emitting area in each pixel. The light-emitting element EL operates to emit light based on a current generated from the driving element DT. Thus, the light is directed out of the display panel 100 through the light-emitting area.

The driving element DT generates the current under a gate-source voltage to drive the light-emitting element EL. The driving element DT includes a gate electrode connected to a first node N1, a first electrode connected to a second node N2, and a second electrode connected to a third node N3. The capacitor C is connected to and disposed between the first node N1 and the third node N3. The second node N2 is connected to the EVDD power line VL. The third node N3 is connected to the anode electrode of the light-emitting element EL. A cathode electrode of the light-emitting element EL is connected to the power line to which the cathode voltage EVSS is applied.

The first switch element T1 is connected to and disposed between the data line DL and the first node N1. The first switch element T1 can be, for example, a scan transistor. The first switch element T1 is turned on in response to the gate pulse SCAN. When the first switch element T1 is turned on, the data voltage Vdata of the pixel data is applied to the first node N1, such that the pixel data is written to the sub-pixel. The first switch element T1 includes a gate electrode connected to the gate line GL, a first electrode connected to the data line DL, and a second electrode connected to the first node N1.

The second switch element T2 is connected to and disposed between the third node N3 and the REF power line RL. The second switch element T2 can be, for example, a sensor transistor. The second switch element T2 is turned on in response to the gate pulse SCAN. When the second switch element T2 is turned on, the third node N3 is connected to the REF power line RL. The second switch element T2 includes a gate electrode connected to each of the gate lines GLn and GLn+1, a first electrode connected to the third node N3, and a second electrode connected to the REF power line RL.

The driving elements DT of all sub-pixels should have uniform electrical characteristics. However, there can be differences between the electrical characteristics of the driving elements DT of the sub-pixels due to process deviation and element characteristic deviation. The differences can increase as an operation time of each of the sub-pixels increases. To compensate for the differences between the electrical characteristics of the driving elements DT of the sub-pixels, an external compensation circuit can be applied to the display panel driving circuit.

The external compensation circuit senses the electrical characteristics of the driving element DT in real time and compensates for the electrical characteristics of the driving element DT based on the sensing result in a sensing mode. The sensing mode can include a sensing mode before a product shipment and a sensing mode after a product shipment. In the sensing mode before the product shipment, the external compensation circuit senses the electrical characteristics of the driving element DT in each of the sub-pixels through the REF power line RL connected to the sub-pixels and compensates for the differences between the electrical characteristics of the driving elements DT of the sub-pixels, based on the sensing result.

The sensing mode after the product shipment can include an ON RF mode executed in the power on sequence, a RT mode executed during the vertical blank period of the display driving period, and an OFF RS mode executed in the power off sequence.

In the ON RF mode, the external compensation circuit senses the mobility of the driving element DT that drives the light-emitting element through the REF power line RL in each sub-pixel when the display device is powered on. The external compensation circuit compares the mobility sensing result with a mobility compensation value of the driving element measured in each sub-pixel before the product shipment, and updates the mobility compensation value based on the comparing result. In the sensing mode before the product shipment, the threshold voltage and the mobility of the driving element DT in each sub-pixel can be sensed, and a threshold voltage compensation value and the mobility compensation value of the driving element are set in a look-up table. The external compensation circuit compensates for the mobility of the driving element of each sub-pixel using the mobility compensation value based on the mobility sensing result of the driving element in each sub-pixel.

In the RT mode, the external compensation circuit senses the mobility of the driving element DT of each sub-pixel in real time through the REF power line RL in the vertical blank period VB every frame period during the display driving period in which the image is displayed, and updates the mobility compensation value in each sub-pixel based on the mobility sensing result. The vertical blank period is a period which is positioned between an active period of an (N−1)-st frame period and an active period of an N-th frame period and for which no data is input to the timing controller 130.

In the OFF RS mode, when the display device is powered off, the external compensation circuit senses the threshold voltage of the driving element DT in each sub-pixel through the REF power line RL, and updates the threshold voltage compensation value of the driving element DT in each sub-pixel, based on the threshold voltage sensing result. In the OFF RS mode, the display panel driving circuit and the external compensation circuit operate for a preset delay time before the power is completely powered off, the external compensation circuit senses the threshold voltage of the driving element DT in each sub-pixel, and updates the threshold voltage compensation value of the driving element DT in each sub-pixel, based on the threshold voltage sensing result.

The external compensation circuit includes an analog-to-digital converter (ADC) electrically connected to the REF power line RL and a compensation circuit that compensates for the data of the ADC. The lookup table of the compensation circuit stores therein compensation values for compensating for the threshold voltage and the mobility of the driving element that drives the light-emitting element in each sub-pixel. The compensation circuit can input the sensing data output from the ADC into the lookup table and add or multiply the compensation value output from the lookup table to the pixel data of the input image to modulate the pixel data to compensate for change in the electrical characteristics of the driving element. The ADC can be disposed per each sensing channel set in the source drive IC into which the data driver 110 is integrated. The compensation circuit can be embodied as a logic circuit of the timing controller 130.

Figure 5:
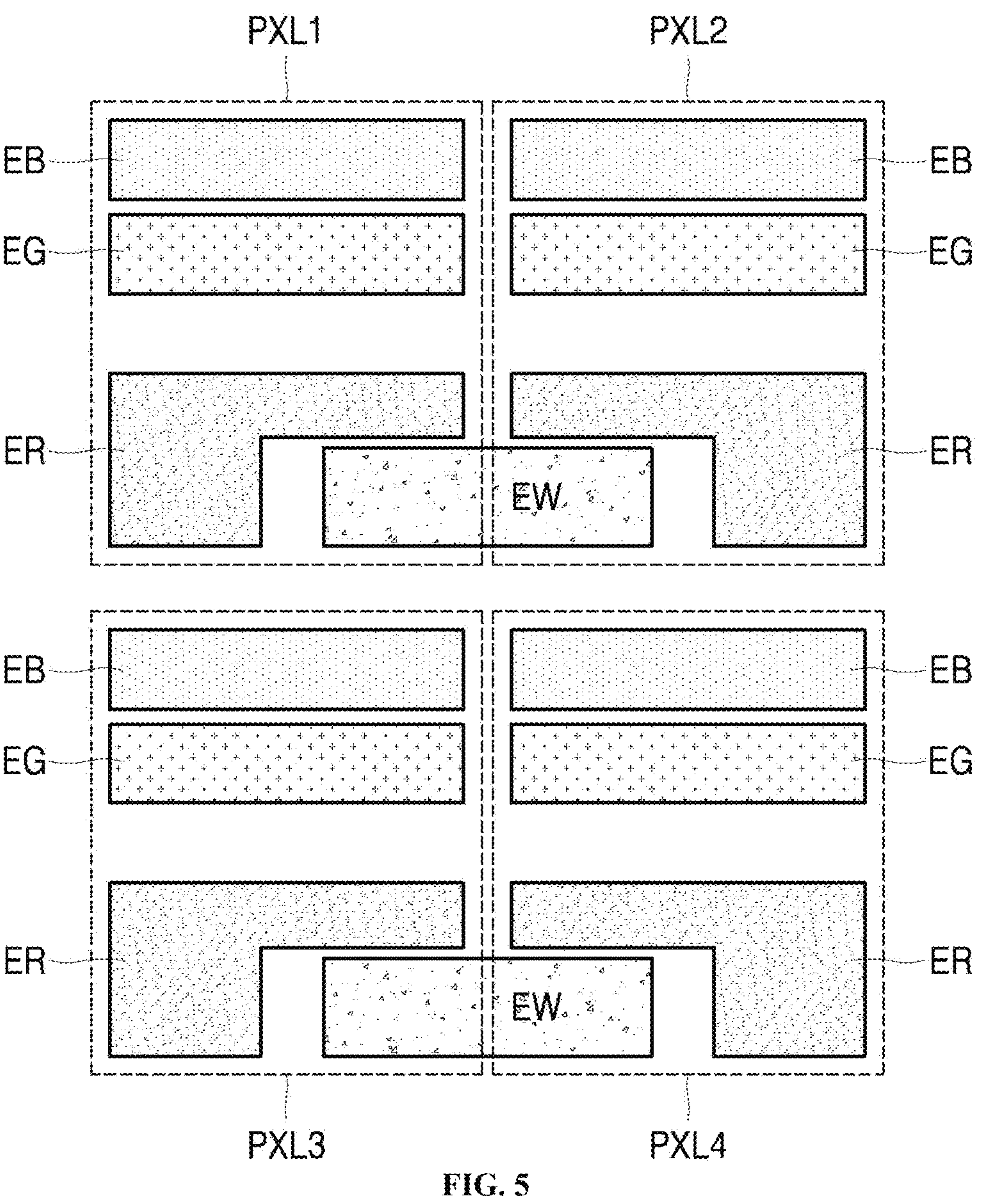
FIG. 5 is a diagram showing light-emitting areas of four pixels.
Figure 6:
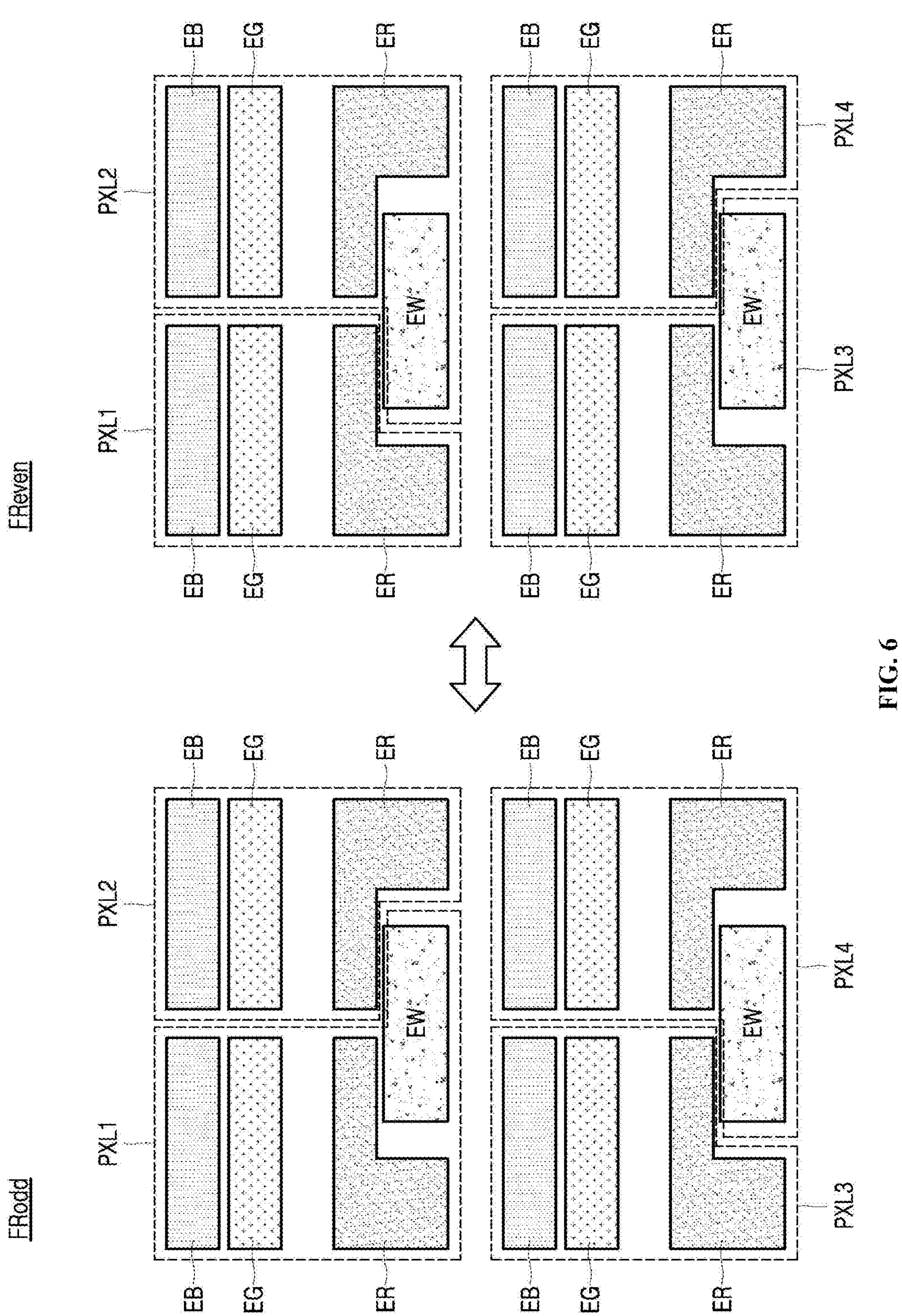
FIG. 6 is a diagram showing an example of a hybrid driving method.

FIG. 5 is a diagram showing light-emitting areas of four pixels. FIG. 6 is a diagram showing an example of a hybrid driving method.

Referring to FIG. 5 and FIG. 6, the third and fourth pixels PXL3 and PXL4 which have substantially the same structures as the first and second pixels PXL1 and PXL2, respectively, are arranged with the first and second pixels PXL1 and PXL2 in the Y-axis direction, respectively.

The first to fourth pixels PXL1 to PXL4 can operate in a hybrid manner as shown in FIG. 6. The first to fourth pixels PXL1 to PXL4 can operate in the 4 sub-pixels and 3 sub-pixels manners alternately with each other on a predetermined time basis. For example, as shown in FIG. 6, during an odd-numbered frame period FRodd, each of the first and fourth pixels PXL1 and PXL4 can operate in the 4 sub-pixels manner, and each of the second and third pixels PXL2 and PXL3 can operate in the 3 sub-pixels manner. As shown in FIG. 6, during an even-numbered frame period FReven, each of the first and fourth pixels PXL1 and PXL4 can operate in the 3 sub-pixels manner and each of the second and third pixels PXL2 and PXL3 can operate in the 4 sub-pixels manner. When the first pixel PXL1 operates in the 4 sub-pixels manner, the W data written to the white sub-pixel can be generated based on the R, G, and B data of the first pixel PXL1. When the second pixel PXL2 operates in the 4 sub-pixels manner, the W data written in the white sub-pixel can be generated based on the R, G, and B data of the second pixel PXL2. When the third pixel PXL3 operates in the 4 sub-pixels manner, the W data written in the white sub-pixel can be generated based on the R, G, and B data of the third pixel PXL3. When the fourth pixel PXL4 operates in the 4 sub-pixels manner, the W data written to the white sub-pixel can be generated based on the R, G, and B data of the fourth pixel PXL4.

Figure 7A:
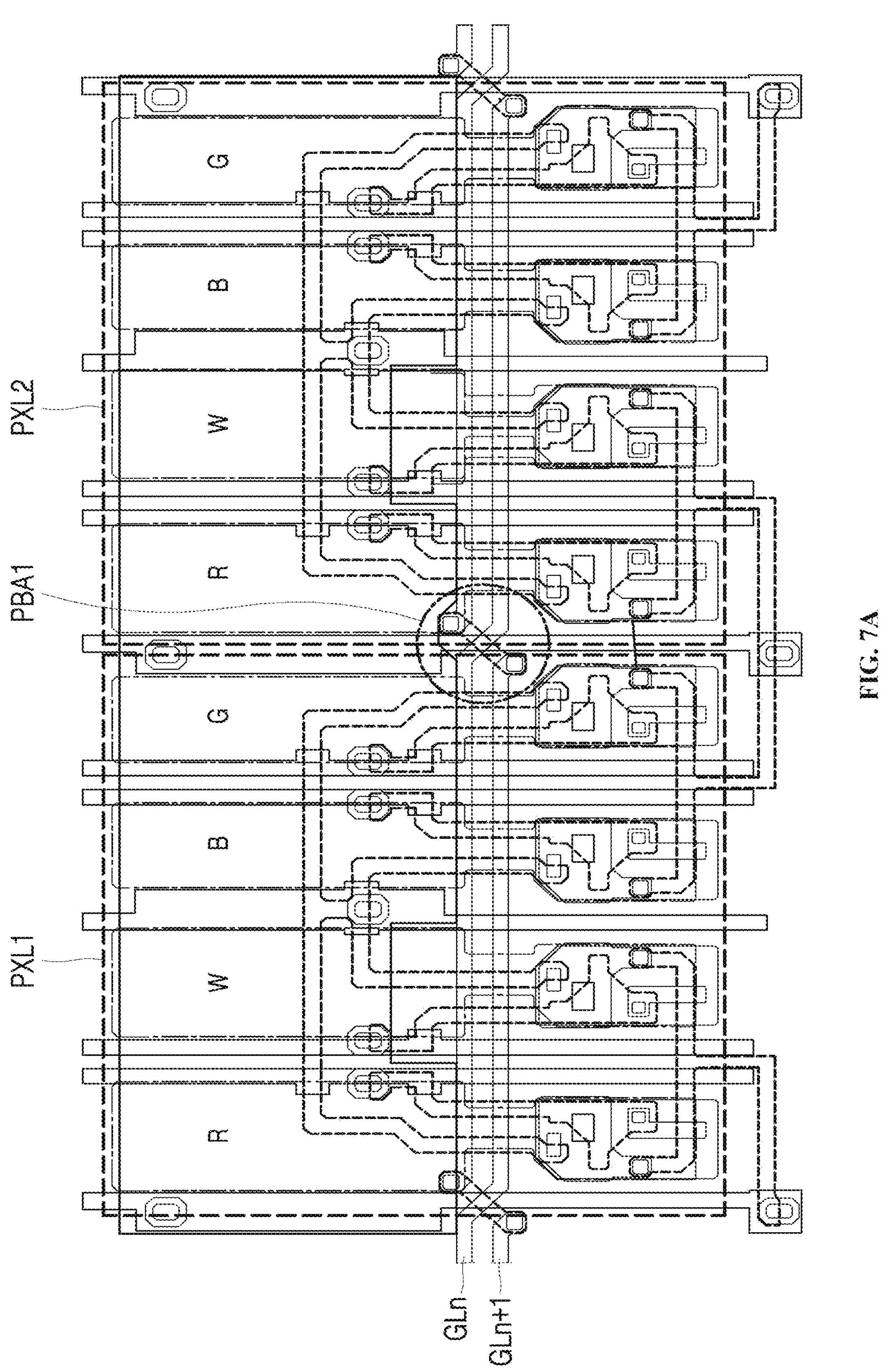
FIG. 7A to FIG. 7C are diagrams showing an example of an arrangement structure of gate lines in a display panel according to an embodiment of the present disclosure.
Figure 7B:
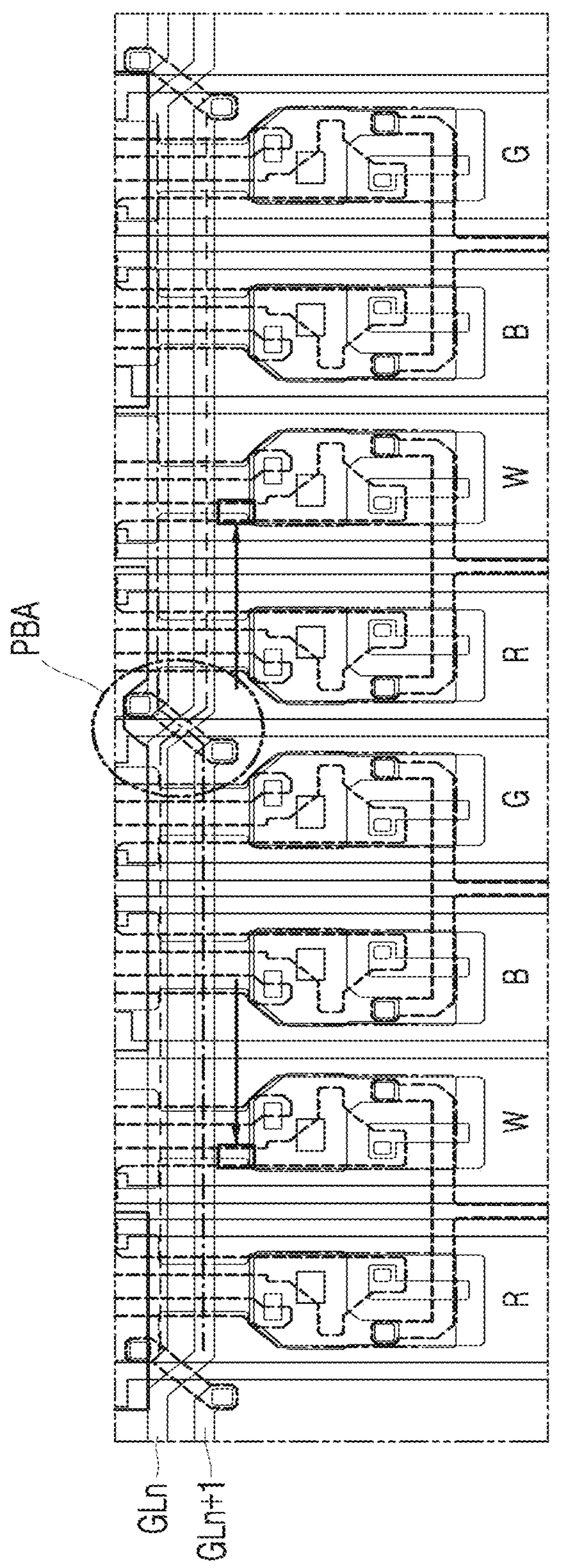
Figure 7C:
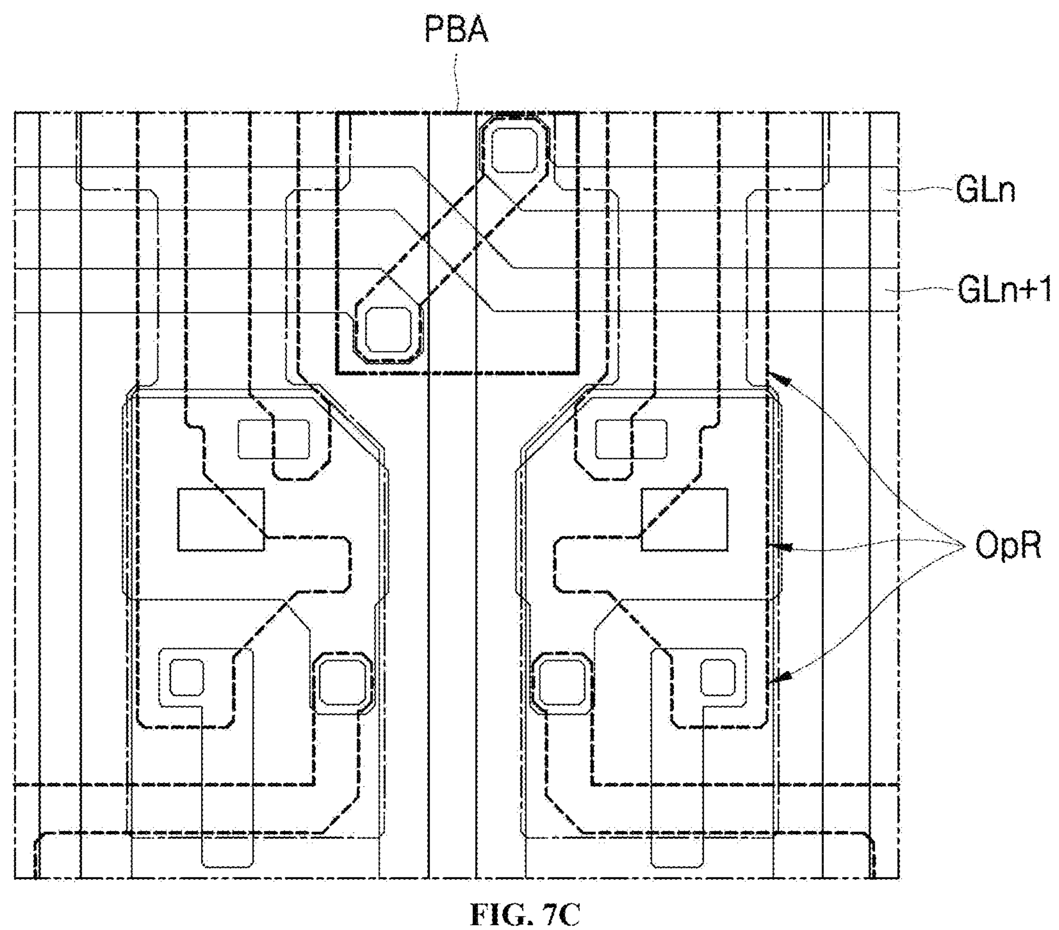

FIG. 7A to FIG. 7C are diagrams showing an example of an arrangement structure of gate lines in a display panel according to an embodiment of the present disclosure.

Referring to FIG. 7A to FIG. 7C, the display panel 100 according to the embodiment of the present disclosure can include a plurality of rows arranged in the second direction Y and extending in the first direction X intersecting the second direction. The display panel 100 can include a first pixel PXL1 and a second pixel PXL2 arranged in an n-th row of the plurality of rows and adjacent to each other in the first direction X.

Each of the first pixel PXL1 and the second pixel PXL2 can include the first to fourth sub-pixels R, W, B, and G respectively emitting light of different colors. The first sub-pixel can be a red sub-pixel R. The second sub-pixel can be a white sub-pixel W. The third sub-pixel can be a blue sub-pixel B. The fourth sub-pixel can be a green sub-pixel G.

The display panel 100 can further include a first pixel PXL1 and a second pixel PXL2 arranged in an (n+1)-st row of the plurality of rows and adjacent to each other in the first direction X. The (n+1)-st row and the n-th row can be arranged in the second direction Y as the column direction.

An n-th gate line GLn and an (n+1)-st gate line GLn+1 can be disposed between the first and second pixels of the n-th row and the first and second pixels of the (n+1)-st row.

The n-th gate line GLn and the (n+1)-st gate line GLn+1 can intersect each other in a pixel border area PBA between the first pixel PXL1 and the second pixel PXL2.

The n-th gate line GLn and the (n+1)-st gate line GLn+1 can be disposed in different layers.

The n-th gate line GLn can be electrically connected to each of the first pixel PXL1 and the second pixel PXL2 arranged in the n-th row.

The (n+1)-st gate line GLn+1 can be electrically connected to each of the first pixel PXL1 and the second pixel PXL2 arranged in the (n+1)-st row.

The n-th gate line GLn and the (n+1)-st gate line GLn+1 can overlap with the second power line (wiring) RL to which the reference voltage Vref is applied and which extends along the second direction Y in the pixel border area PBA1 between the first pixels PXL1 and the second pixels PXL2.

In this regard, as shown in FIG. 7A and FIG. 7B, it is illustrated that in each of the first pixel PXL1 and the second pixel PXL2, the first to fourth sub-pixels R, W, B, and G are arranged in the same row. However, embodiments of the present disclosure are not limited thereto. For example, the first pixel PXL1 and the second pixel PXL2 can share the white sub-pixel W.

Each of the first sub-pixels includes a first pixel circuit and a first light-emitting area connected to the first pixel circuit. Each of the second sub-pixels includes a second pixel circuit and a second light-emitting area connected to the second pixel circuit.

Furthermore, each of the third sub-pixels includes a third light-emitting area connected to the third pixel circuit and the third pixel circuit. Each of the fourth sub-pixels includes a fourth pixel circuit and a fourth light-emitting area connected to the fourth pixel circuit.

As shown in FIG. 7A to FIG. 7C, the n-th gate line GLn and the (n+1)-st gate line GLn+1 can intersect each other in the pixel border area PBA1 between the first pixel PXL1 and the second pixel PXL2.

Therefore, as shown in FIG. 7C, the display panel 100 according to an embodiment of the present disclosure has a structure of compensation for the overload OVL change of the capacitor Cst, and does not require a pattern PTN for the compensation, and is robust to the overload OVL change. Further, the aperture ratio (Open Rate) OpR of the pixel can be increased.

Figure 8A:
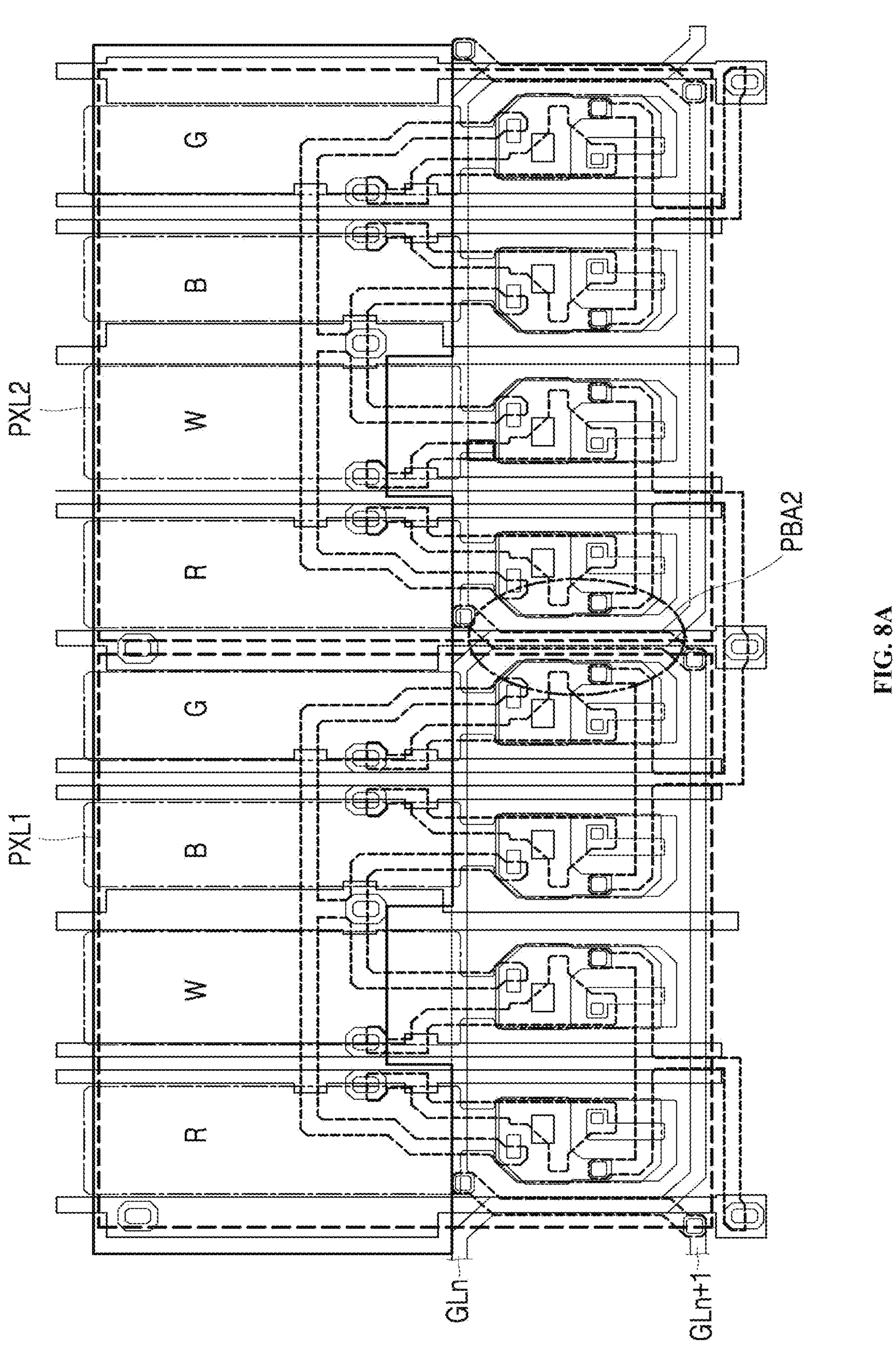
FIG. 8A to FIG. 8C are diagrams showing an example of an arrangement structure of gate lines in a display panel according to another embodiment of the present disclosure.
Figure 8B:
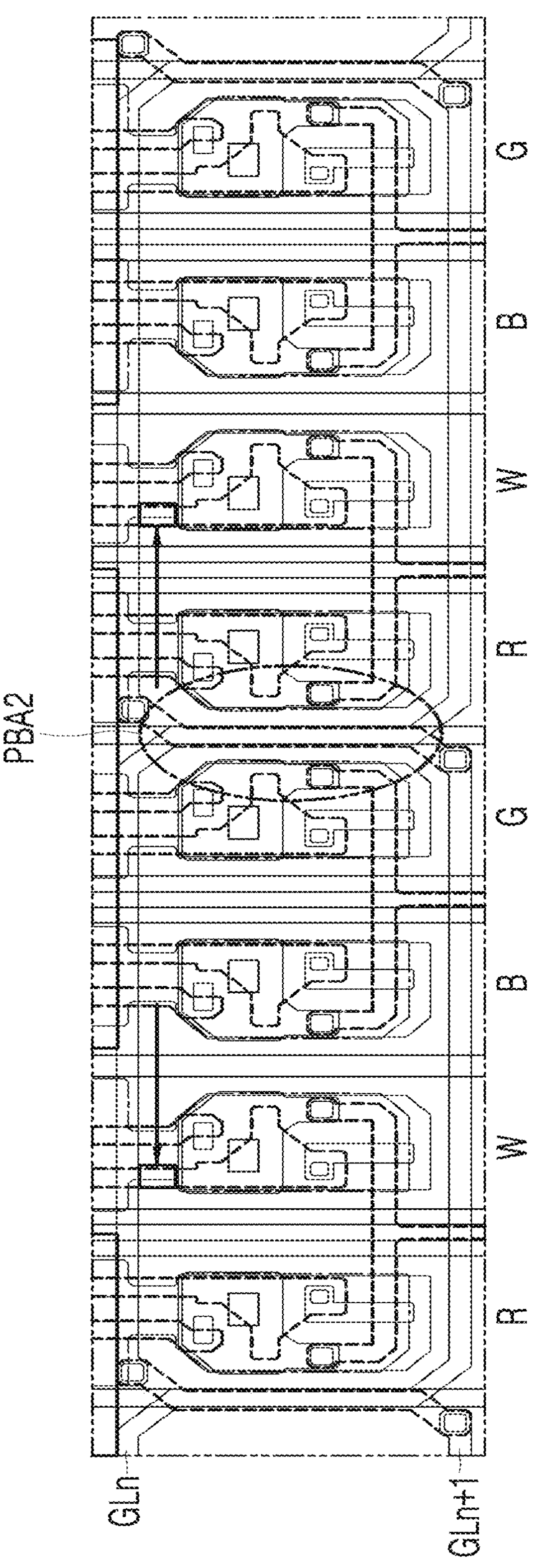
Figure 8C:
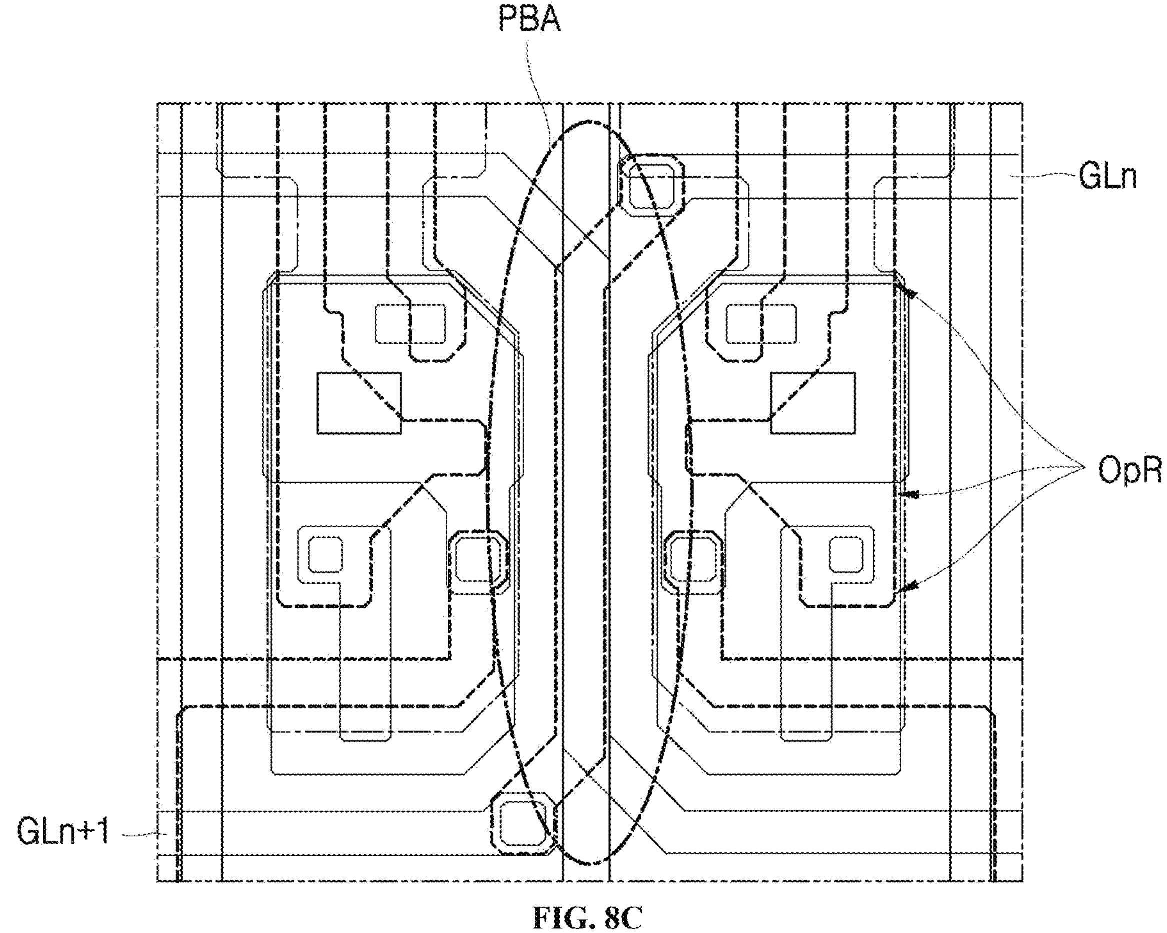

FIG. 8A to FIG. 8C are diagrams showing an example of an arrangement structure of gate lines in a display panel according to another embodiment of the present disclosure.

Referring to FIG. 8A to FIG. 8C, the display panel 100 according to the embodiment of the present disclosure can include a plurality of rows arranged in the second direction Y and extending in the first direction X intersecting the second direction. The display panel 100 can include a first pixel PXL1 and a second pixel PXL2 arranged in an n-th row of the plurality of rows and adjacent to each other in the first direction X.

Each of the first pixel PXL1 and the second pixel PXL2 can include the first to fourth sub-pixels R, W, B, and G respectively emitting light of different colors. The first sub-pixel can be a red sub-pixel R. The second sub-pixel can be a white sub-pixel W. The third sub-pixel can be a blue sub-pixel B. The fourth sub-pixel can be a green sub-pixel G.

The display panel 100 can further include a first pixel PXL1 and a second pixel PXL2 arranged in an (n+1)-st row of the plurality of rows and adjacent to each other in the first direction X. The (n+1)-st row and the n-th row can be arranged in the second direction Y as the column direction.

The n-th gate line GLn and the (n+1)-st gate line GLn+1 can intersect each other in the pixel border area PBA2 between the first pixel PXL1 and the second pixel PXL2.

Thus, the n-th gate line GLn can be disposed on one of both opposing sides in the second direction of the first pixel PXL1 and then be disposed on the other of both opposing sides in the second direction of the second pixel PXL2 arranged in the n-th row.

Further, the (n+1)-st gate line GLn+1 can be disposed on the other of both opposing sides in the second direction of the first pixel PXL1 and then be disposed on one of both opposing sides in the second direction of the second pixel PXL2 arranged in the n-th row.

In the n-th row, the n-th gate line GLn can extend along one of both opposing sides in the second direction of the first pixel PXL1 in the first direction and then can be bent toward the other side of both opposing sides in the second direction of the second pixel PXL2 in the pixel border area PBA2 between the first and second pixel while overlapping the second power line (wiring) RL in the area PBA2, and then can extend along the other of both opposing sides in the second direction of the second pixel PXL2.

Further, in the n-th row, the (n+1)-st gate line GLn can extend along the other of both opposing sides in the second direction of the first pixel PXL1 in the first direction and then can be bent toward one of both opposing sides in the second direction of the second pixel PXL2 in the pixel border area PBA2 between the first and second pixel while overlapping the second power line (wiring) RL in the area PBA2, and then can extend along one of both opposing sides in the second direction of the second pixel PXL2.

The n-th gate line GLn and the (n+1)-st gate line GLn+1 can be disposed in different layers.

The n-th gate line GLn can be electrically connected to the first pixel PXL1 in the n-th row and the second pixel PXL2 in the (n+1)-st row.

The (n+1)-st gate line GLn+1 can be electrically connected to the first pixel PXL1 in the (n+1)-st row and the second pixel PXL2 in the n-th row.

The n-th gate line GLn and the (n+1)-st gate line GLn+1 can overlap with the second power line (wiring) RL to which the reference voltage Vref is applied and which extends along the second direction Y in the pixel border area PBA2 between the first pixels PXL1 and the second pixels PXL2.

The n-th gate line GLn and the (n+1)-st gate line GLn+1 can intersect each other in the pixel border area PBA2 between the first pixel PXL1 and the second pixel PXL2.

In this regard, as shown in FIG. 8A and FIG. 8B, it is illustrated that in each of the first pixel PXL1 and the second pixel PXL2, the first to fourth sub-pixels R, W, B, and G are arranged in the same row. However, embodiments of the present disclosure are not limited thereto. For example, the first pixel PXL1 and the second pixel PXL2 can share the white sub-pixel W.

Each of the first sub-pixels includes a first pixel circuit and a first light-emitting area connected to the first pixel circuit. Each of the second sub-pixels includes a second pixel circuit and a second light-emitting area connected to the second pixel circuit.

Furthermore, each of the third sub-pixels includes a third light-emitting area connected to the third pixel circuit and the third pixel circuit. Each of the fourth sub-pixels includes a fourth pixel circuit and a fourth light-emitting area connected to the fourth pixel circuit.

Therefore, as shown in FIG. 8C, the display panel 100 according to an embodiment of the present disclosure has a structure of compensation for the overload OVL change of the capacitor Cst, and does not require a pattern PTN for the compensation, and is robust to the overload OVL change. Further, the aperture ratio (Open Rate) OpR of the pixel can be increased.

Figure 9A:
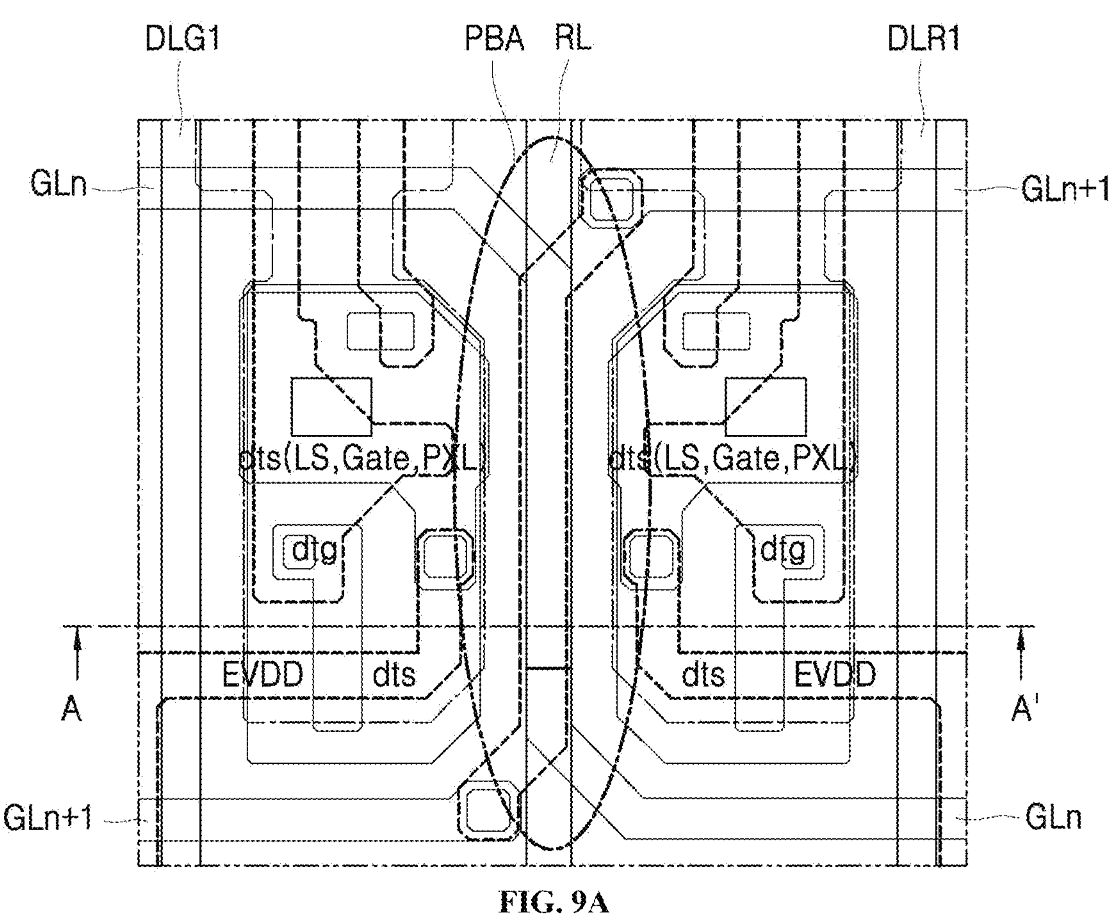
FIG. 9A is a diagram showing an example in which first and second gate lines intersect each other in a pixel border area in a display panel according to an embodiment of the present disclosure.
Figure 9B:
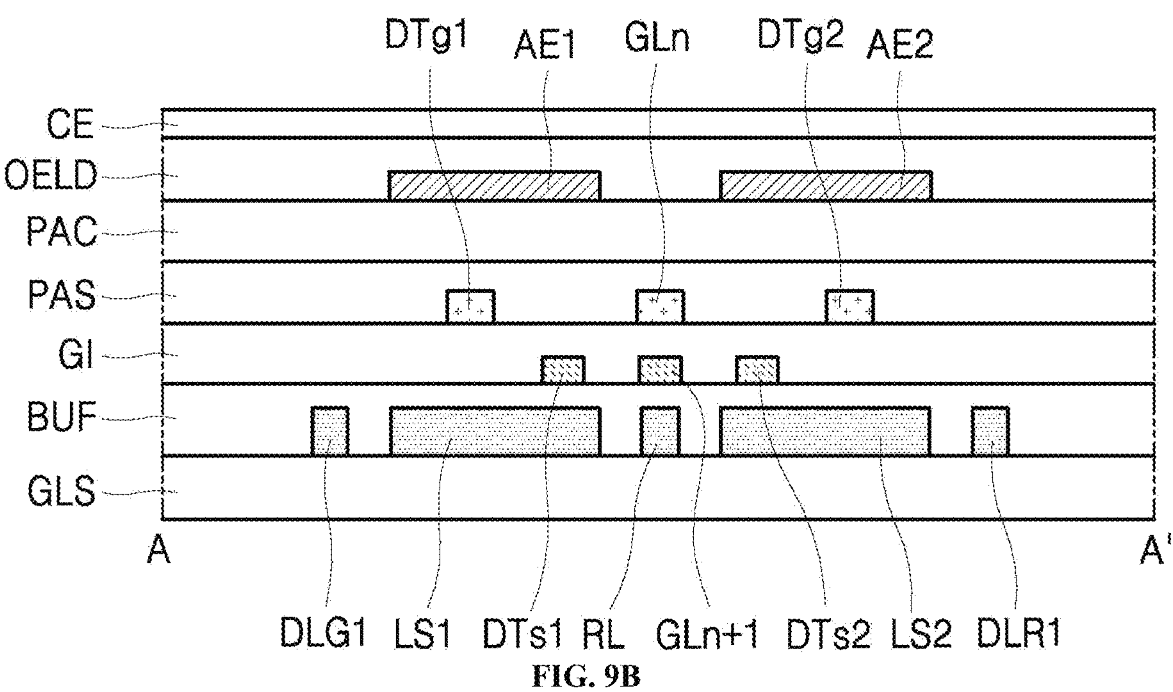
FIG. 9B is a cross-sectional view cut along a A-A' line of FIG. 9A in the display panel according to the embodiment of the present disclosure.

FIG. 9A is a diagram showing an example in which the first and second gate lines intersect at the pixel border area of the display panel according to the embodiment of the present disclosure. FIG. 9B is a cross-sectional view cut along a A-A' line of FIG. 9A in the display panel according to the embodiment of the present disclosure.

Referring to FIG. 9A, the display panel 100 according to the embodiment of the present disclosure is configured so that the first gate line GLn and the second gate line GLn+1 intersect each other in the pixel border area PBA between the first and second pixels. In this pixel border area PBA, each of the first gate line GLn and the second gate line GLn+1 can overlap with the second power line RL extending in the second direction.

Referring to FIG. 9B, the display panel 100 according to the embodiment of the present disclosure can include a second data line DLG1, a first light shielding film LS1, the second power line RL, a second light shielding film LS2, and a third data line DLR1 disposed on a substrate GLS.

A buffer film BUF can be disposed on the substrate GLS, the second data line DLG1, the first light shielding film LS1, the second power line RL, the second light shielding film LS2, and the third data line DLR1.

The first and second light shielding films LS1 and LS2 can be formed so as to overlap the channel area or the semiconductor layer ACT of the driving transistor DT. Each of the first and second light shielding films LS1 and LS2 can be made of metal such as copper (Cu), and not only block external light, but also connect to other electrodes or lines, and can be used as the electrode that constitutes the capacitor, etc.

A first source line DTs1 of the driving transistor DT, the (n+1)-st gate line GLn+1, and a second source line DTs2 of the driving transistor DT can be disposed on the buffer film BUF.

A gate insulating film GI can be disposed on the buffer film BUF, the first and second source lines DTs1 and DTs2 of the driving transistor DT, and the (n+1)-st gate line GLn+1. In this regard, the (n+1)-st gate line GLn+1 can be referred to as the second gate line GLn+1.

The first and second source lines DTs1 and DTs2 of the driving transistor DT and the (n+1)-st gate line GLn+1 can constitute the semiconductor layer ACT. The semiconductor layer ACT is a semiconductor layer of the driving transistor DT and can be embodied as an oxide semiconductor layer made of, for example, IGZO. For example, a portion of the semiconductor layer ACT corresponding to each of the source area and the drain area excluding a portion thereof corresponding to a channel area can be conductive and act as a metal electrode or a wiring (metallization) which acts as each of the first and second source lines DTs1 and DTs2 of the driving transistor DT and the (n+1)-st gate line GLn+1. The conductivization process can use $O_2$ plasma or an etching process. However, embodiments of the present disclosure are not limited thereto.

A first gate line DTg1 of the driving transistor DT, the n-th gate line GLn, and a second gate line DTg2 of the driving transistor DT can be disposed on the gate insulating film GI. In this regard, the n-th gate line GLn can be referred to as the first gate line GLn.

A passivation film PAS can be disposed on the gate insulating film GI, the first and second gate lines DTg1 and DTg2 of the driving transistor DT, and the n-th gate line GLn.

A planarization film PAC can be disposed on the passivation film PAS.

A first anode electrode AE1 and a second anode electrode AE2 can be disposed on the planarization film PAC. The first anode electrode AE1 can be an electrode disposed in the first pixel PXL1, and the second anode electrode AE2 can be an electrode disposed in the second pixel PXL2.

An organic light-emitting layer OLED can be disposed on the planarization film PAC and the first anode electrode AE1 and the second anode electrode AE2.

A cathode electrode CE can be disposed on the organic light-emitting layer OLED.

Each of the first and second anode electrodes AE1 and AE2 can include (ITO Indium Tin Oxide). The cathode electrode CE can include metal such as aluminum (Al).

Thus, in the display panel and the display device according to aspects of the present disclosure, the asymmetric structure due to the conventional flip structure is removed in that two gate lines arranged in a column direction and extending in a row direction intersect each other in a pixel border area between odd and even-numbered pixels arranged in the row direction such that a difference between luminance of the odd and even-numbered pixels can be removed, and thus, a column-directional line mura defect can be removed or minimized and further, the aperture ratio can be improved.

Further, according to various embodiments of the present disclosure, there can be provided the display device including the above defined display panel.

Although embodiments of the present disclosure have been described with reference to the accompanying drawings, the present disclosure is not limited to the above embodiments, but can be implemented in various different forms. A person skilled in the art can appreciate that the present disclosure can be practiced in other concrete forms without changing the technical spirit or essential characteristics of the present disclosure. Therefore, it should be appreciated that the embodiments as described above is not restrictive but illustrative in all respects.

What is claimed is:

1. A display panel comprising:

a first pixel and a second pixel arranged in an n-th row and disposed adjacent to each other in a first direction; and a first pixel and a second pixel arranged in an (n+1)-st row and disposed adjacent to each other in the first direction, wherein the n-th row and the (n+1)-st row are arranged in a second direction intersecting the first direction, where n is a real number, wherein each of the first pixel and the second pixel in each of the n-th row and the (n+1)-st row includes first to fourth sub-pixels configured to respectively emit light of different colors, wherein both an n-th gate line and an (n+1)-st gate line are disposed between the first and second pixels of the n-th row and the first and second pixels of the (n+1)-st row, and wherein the n-th gate line and the (n+1)-st gate line intersect each other in a pixel border area between the first pixel and the second pixel, wherein the first pixel and the second pixel share a white sub-pixel, wherein each of the first sub-pixels includes a first pixel circuit and a first light-emitting area connected to the first pixel circuit, wherein each of the second sub-pixels includes a second pixel circuit and a second light-emitting area connected to the second pixel circuit, wherein each of the third sub-pixels includes a third pixel circuit and a third light-emitting area connected to the third pixel circuit, wherein each of the white sub-pixels includes a fourth pixel circuit and a fourth light-emitting area connected to the fourth pixel circuit, wherein the display panel further comprises power lines configured to supply a constant voltage to the pixel circuits, wherein the power lines extend along the second direction so as to overlap the first light-emitting area, the second light-emitting area, and the third light-emitting area, wherein the power lines include:

a first power line to which a pixel driving voltage is applied; and second power lines respectively disposed on opposing sides in the first direction of the first power line and connected to each other, and wherein a width of the first power line is greater than a width of each of the second power lines.

2. The display panel of claim 1, wherein the n-th gate line and the (n+1)-st gate line are disposed in different layers.

3. The display panel of claim 1, wherein the n-th gate line is electrically connected to each of the first pixel and the second pixel arranged in the n-th row, and wherein the (n+1)-st gate line is electrically connected to each of the first pixel and the second pixel arranged in the (n+1)-st row.

4. The display panel of claim 1, wherein each of the n-th gate line and the (n+1)-st gate line overlaps a second power line in the pixel border area between the first pixels and the second pixels, and wherein the second power line receives a reference voltage applied thereto and extends along the second direction.

5. The display panel of claim 1, wherein the first to third light-emitting areas of the first pixel and the first to third light-emitting areas of the second pixel in each of the n-th row and the (n+1)-st row are arranged in a mirror symmetry manner with each other, and wherein the fourth light-emitting area is arranged between the third light-emitting area of the first pixel and the third light-emitting area of the second pixel in the first direction.

6. The display panel of claim 1, wherein the display panel further comprises a plurality of data line pairs configured to supply a data voltage of pixel data to the pixel circuits, wherein the plurality of data line pairs include first and second data line pairs, wherein the first data line pair includes:

a first data line extending in the second direction and connected to a plurality of first pixel circuits arranged along the second direction; and a second data line extending in the second direction and connected to a plurality of second pixel circuits arranged along the second direction, and wherein the second data line pair includes:

a third data line extending in the second direction and connected to a plurality of third pixel circuits arranged along the second direction; and a fourth data line extending in the second direction and connected to a plurality of fourth pixel circuits arranged along the second direction.

7. The display panel of claim 6, wherein the fourth light-emitting areas include:

a (4-1)-st light-emitting area adjacent to the third light-emitting area in the first pixel in the second direction; and a (4-2)-nd light-emitting area adjacent to the third light-emitting area in the second pixel in the second direction, and wherein the fourth pixel circuits include:

a (4-1)-st pixel circuit connected to the (4-1)-st light-emitting area; and a (4-2)-nd pixel circuit connected to the (4-2)-nd fourth light-emitting area.

* * * * *